United States Patent
Komatsu et al.

(10) Patent No.: US 7,499,041 B2
(45) Date of Patent: *Mar. 3, 2009

(54) INTEGRATED CIRCUIT DEVICE

(75) Inventors: Fumikazu Komatsu, Okaya (JP); Yasunari Furuya, Fujimi (JP)

(73) Assignee: Seiko Epson Corporation (JP)

( * ) Notice: Subject to any disclaimer, the term of this patent is extended or adjusted under 35 U.S.C. 154(b) by 295 days.

This patent is subject to a terminal disclaimer.

(21) Appl. No.: 11/475,622

(22) Filed: Jun. 27, 2006

(65) Prior Publication Data

US 2007/0002189 A1 Jan. 4, 2007

(30) Foreign Application Priority Data

Jun. 30, 2005 (JP) ............... 2005-193021

(51) Int. Cl.
*G09G 5/00* (2006.01)
(52) U.S. Cl. ............... 345/204; 345/102; 345/690; 345/104
(58) Field of Classification Search ........... 345/204, 345/206, 210, 104, 211
See application file for complete search history.

(56) References Cited

U.S. PATENT DOCUMENTS

| | | | | |
|---|---|---|---|---|
| 5,841,414 A * | 11/1998 | Tanaka | ............ | 345/87 |
| 6,707,314 B2 * | 3/2004 | Kasahara et al. | ............ | 326/38 |
| 6,853,430 B2 * | 2/2005 | Murahashi et al. | ............ | 349/150 |
| 7,049,689 B2 * | 5/2006 | Yeh et al. | ............ | 257/678 |
| 7,283,132 B2 * | 10/2007 | Ishibashi et al. | ............ | 345/212 |
| 2002/0011998 A1 * | 1/2002 | Tamura | ............ | 345/204 |
| 2003/0011582 A1 * | 1/2003 | Morita | ............ | 345/204 |
| 2006/0244741 A1 * | 11/2006 | Kimura et al. | ............ | 345/204 |
| 2007/0002033 A1 * | 1/2007 | Komatsu et al. | ............ | 345/204 |

FOREIGN PATENT DOCUMENTS

JP 2001-222249 8/2001

* cited by examiner

*Primary Examiner*—Vibol Tan
(74) *Attorney, Agent, or Firm*—Harness, Dickey & Pierce, P.L.C.

(57) ABSTRACT

An integrated circuit device 10 includes an interface circuit block 120, wherein, when a direction from a first side LS1 which is a short side of the interface circuit block 120 to a third side LS3 opposite to the first side LS1 is defined as a first direction DR1 and a direction from a fourth side LS4 which is a long side of the interface circuit block 120 to a second side LS2 opposite to the fourth side LS4 is defined as a second direction DR2, the interface circuit block 120 includes a circuit formation area 122 in which a circuit which performs given processing is formed, an input terminal formation area 124 which is disposed on a side of the circuit formation area 122 in the second direction DR2 and in which a plurality of input terminals PAD are provided on the second side LS2 along the first direction DR1, and a plurality of power supply lines DRVSS and DRVDD1 to DRVDD3 for the integrated circuit device 10 formed to extend along the first direction DR1 in the input terminal formation area 124 in an interconnect layer ALC in a lower layer of an interconnect layer ALE in which the input terminals PAD are formed.

18 Claims, 20 Drawing Sheets

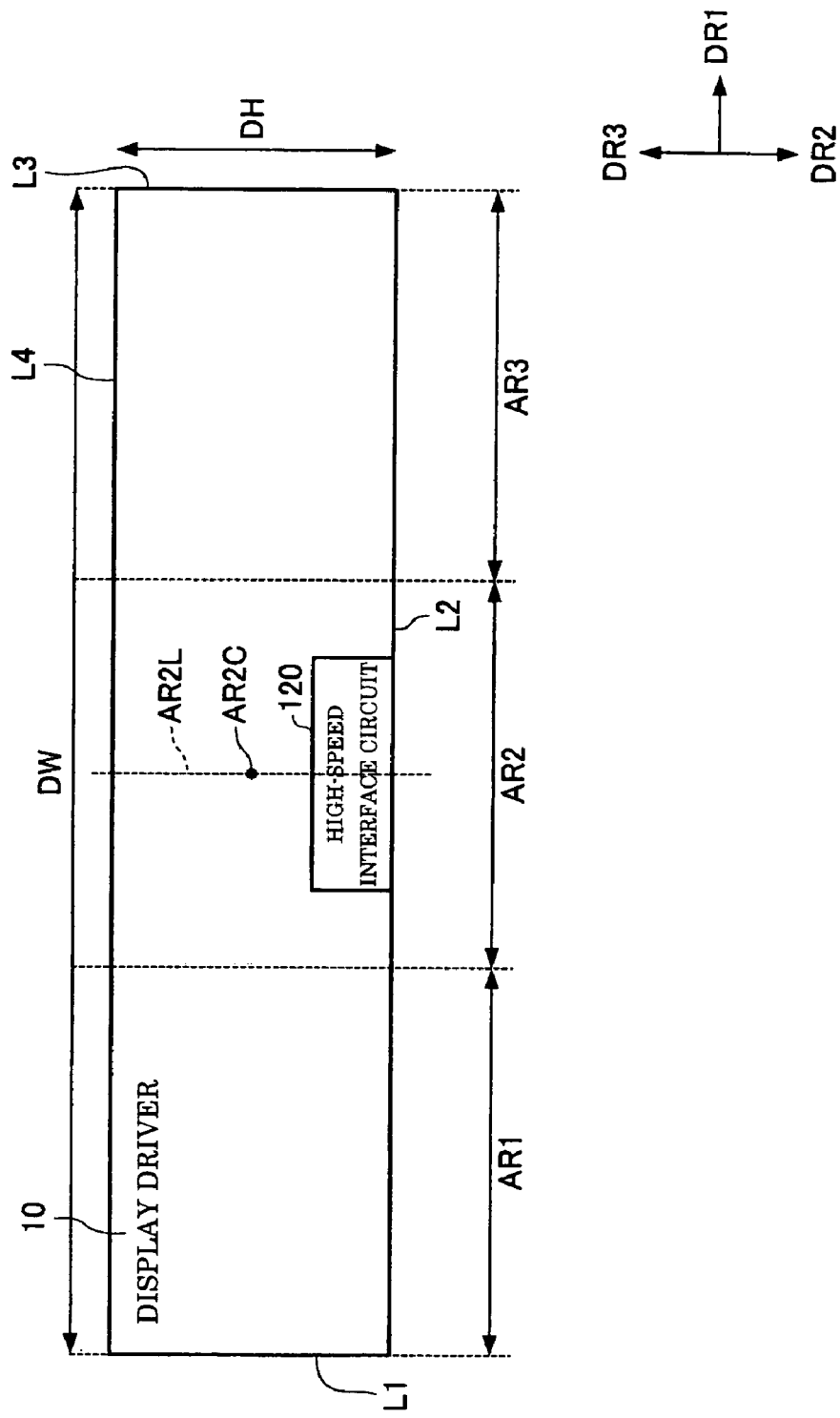

INTEGRATED CIRCUIT DEVICE

Japanese Patent Application No. 2005-193021 filed on Jun. 30, 2005, is hereby incorporated by reference in its entirety.

BACKGROUND OF THE INVENTION

The present invention relates to an integrated circuit device.

In recent years, a high-speed serial transfer interface such as a low voltage differential signaling (LVDS) interface has attracted attention as an interface aiming at reducing EMI noise or the like. In such a high-speed serial transfer, data is transferred by causing a transmitter circuit to transmit serialized data using differential signals and causing a receiver circuit to differentially amplify the differential signals.

A known portable telephone includes a first instrument section provided with buttons for inputting a telephone number or characters, a second instrument section provided with a display panel or a camera, and a connection section (e.g. hinge) which connects the first and second instrument sections. Therefore, the number of interconnects passing through the connection section can be reduced by transferring data between a first substrate provided in the first instrument section and a second substrate provided in the second instrument section by serial transfer using differential signals. JP-A-2001-222249 (US2002/0011998A1) discloses a technology of performing serial transfer in a portable telephone using differential signals.

A display driver (LCD driver) is known as an integrated circuit device which drives a display panel such as a liquid crystal panel. In order to realize high-speed serial transfer between the above-mentioned first and second instrument sections, a high-speed interface circuit which transfers data through a serial bus must be incorporated in the display driver.

However, when the integrated circuit device as the display driver is mounted using a chip on glass (COG) technology, the signal quality of high-speed serial transfer deteriorates due to contact resistance at a bump as an external connection terminal.

A reduction in chip size is required for the display driver in order to reduce cost. On the other hand, the size of the display panel incorporated in a portable telephone or the like is approximately the same. Therefore, if the chip size is reduced by merely shrinking the integrated circuit device as the display driver using a microfabrication technology, it becomes difficult to mount the integrated circuit device.

SUMMARY

One aspect of the invention relates to an integrated circuit device comprising an interface circuit block which transfers data through a serial bus using differential signals, when a direction from a first side which is a short side of the interface circuit block to a third side opposite to the first side is defined as a first direction and a direction from a fourth side which is a long side of the interface circuit block to a second side opposite to the fourth side is defined as a second direction, the interface circuit block including a circuit formation area in which a circuit which performs given processing is formed, an input terminal formation area which is disposed on a side of the circuit formation area in the second direction and in which a plurality of input terminals are provided on the second side along the first direction, and a plurality of power supply lines for the integrated circuit device formed to extend along the first direction in the input terminal formation area in a first interconnect layer in a lower layer of a second interconnect layer in which the input terminals are formed.

BRIEF DESCRIPTION OF THE SEVERAL VIEWS OF THE DRAWING

FIG. 1 is a diagram showing a display driver according to one embodiment of the invention.

DETAILED DESCRIPTION OF THE EMBODIMENT

Figure 2A:
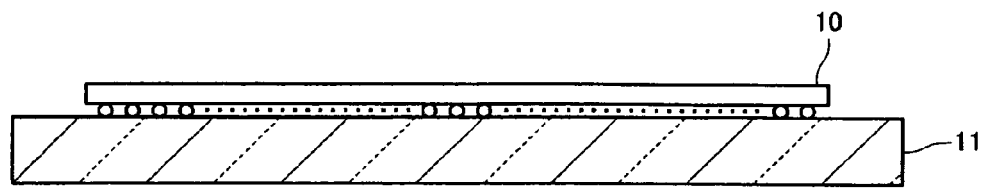
FIGS. 2A to 2C are diagrams illustrative of a change in contact resistance.

The invention may provide an integrated circuit device which can maintain the signal quality of high-speed serial transfer.

One embodiment of the invention relates to an integrated circuit device comprising an interface circuit block which transfers data through a serial bus using differential signals, when a direction from a first side which is a short side of the interface circuit block to a third side opposite to the first side is defined as a first direction and a direction from a fourth side which is a long side of the interface circuit block to a second side opposite to the fourth side is defined as a second direction, the interface circuit block including a circuit formation area in which a circuit which performs given processing is formed, an input terminal formation area which is disposed on a side of the circuit formation area in the second direction and in which a plurality of input terminals are provided on the second side along the first direction, and a plurality of power supply lines for the integrated circuit device formed to extend along the first direction in the input terminal formation area in a first interconnect layer in a lower layer of a second interconnect layer in which the input terminals are formed.

The degrees of freedom of the layout of circuits of a display driver can be increased by forming the power supply lines in the input terminal formation area as described above. This allows a reduction in the layout area of the display driver. Moreover, since a protection circuit can be easily connected between each input terminal and the power supply line by forming the power supply lines in the input terminal formation area, an efficient layout can be achieved in the interface circuit block.

In the integrated circuit device according to this embodiment, the input terminals may include a plurality of differential signal input terminals for supplying the differential signals to the interface circuit block, and a plurality of power supply input terminals for supplying power to the interface circuit block, the input terminal formation area may include a differential signal input terminal formation area in which the differential signal input terminals are formed, and first and second power supply input terminal formation areas in which the power supply input terminals are formed, and the differential signal input terminal formation area may be provided between the first power supply input terminal formation area and the second power supply input terminal formation area.

It becomes possible to deal with external noise by placing the differential signal input terminals between the first power supply input terminals.

In the integrated circuit device according to this embodiment, the differential signal input terminals may be disposed in the differential signal input terminal formation area on the second side along the first direction, and the power supply input terminals may be formed in the first and second power supply input terminal formation areas on the second side along the first direction.

In the integrated circuit device according to this embodiment, the power supply input terminals may include a plurality of first power supply input terminals for supplying a first power supply voltage, and a plurality of second power supply input terminals for supplying a second power supply voltage higher than the first power supply voltage, and the power supply lines for the integrated circuit device may include a first power supply line for supplying the first power supply voltage.

In the integrated circuit device according to this embodiment, at least one input terminal on at least one of the first side and the third side among the plurality of input terminals may be set as at least one of the first power supply input terminals.

In the integrated circuit device according to this embodiment, the first power supply input terminal provided on at least one of the first side and the third side may be connected with the first power supply line through a first protection circuit.

This allows the first power supply input terminal to be connected with the first protection circuit through a short interconnect.

In the integrated circuit device according to this embodiment, the first protection circuit may be formed by a diode.

In the integrated circuit device according to this embodiment, at least one of the first power supply input terminals may be connected with the first power supply line through a first protection circuit, and the first protection circuit may be disposed in the circuit formation area on a side of the input terminal formation area on at least one of the first side and the third side.

This allows the first protection circuit to be connected with the first power supply line through a short interconnect.

In the integrated circuit device according to this embodiment, at least one of the second power supply input terminals may be connected with the first power supply line through a decoupling capacitor, and the decoupling capacitor may be disposed in the circuit formation area on at least one of the first side and the third side.

The power supply in the interface circuit block can be stabilized by connecting the second power supply input terminal with the first power supply line through the decoupling capacitor. Moreover, since the decoupling capacitor can be efficiently disposed in the interface circuit block, the power supply in the interface circuit block can be stabilized even when mounting the interface circuit block on a substrate (e.g. glass substrate) on which it is difficult to form a capacitor.

In the integrated circuit device according to this embodiment, at least one of the first power supply input terminals may be connected with the first power supply line through a second protection circuit, and the second protection circuit may be formed in a semiconductor layer in the input terminal formation area in an area in which the input terminal is not formed and which is located between the differential signal input terminal formed in the differential signal input terminal formation area and the first power supply input terminal formed in at least one of the first and second power supply input terminal formation areas.

It becomes unnecessary to provide a space for providing the protection circuit in the circuit formation area by forming the second protection circuit as described above, whereby the layout area of the interface circuit block can be reduced. This also facilitates connection with the first power supply line.

In the integrated circuit device according to this embodiment, the second protection circuit may not be formed in the semiconductor layer in an area in which the plurality of input terminals are formed.

The layout of the interface circuit block can be used irrespective of the mounting form by not forming the second protection circuit in the semiconductor layer in the area in which the input terminals are formed, whereby the design cost can be reduced.

In the integrated circuit device according to this embodiment, the second protection circuit may be formed by a diode.

The integrated circuit device according to this embodiment may further comprise first to Sth receiver circuits, each of which receives the differential signals, and a bias circuit for supplying a constant voltage to the first to Sth receiver circuits, wherein the first to [S/2]th ([X] is a maximum integer equal to or less than X) receiver circuits, the bias circuit, and the ([S/2]+1)th to Sth receiver circuits may be disposed in that order in the circuit formation area along the first direction.

The bias circuit can supply a constant voltage equally to each receiver circuit by disposing the receiver circuits and the bias circuit as described above.

In the integrated circuit device according to this embodiment, the differential signal input terminal formation area may be disposed on a side of the first to Sth receiver circuits and the bias circuit in the second direction.

Since this layout allows the differential signals to be supplied from the differential signal input terminals to the receiver circuits through short interconnects, a high-speed data transfer showing only a small degree of signal deterioration can be achieved.

The integrated circuit device according to this embodiment may further comprise a logic circuit which processes signals from the first to Sth receiver circuits, wherein the first to Sth receiver circuits may be disposed on a side of the logic circuit in the second direction.

Since this layout allows a signal supplied from each input terminal to linearly and spontaneously flow to the logic circuit, a high-speed interface circuit exhibiting excellent characteristics can be obtained.

The embodiments of the invention are described below with reference to the drawings. Note that the embodiments described below do not in any way limit the scope of the invention laid out in the claims. Note that all elements of the embodiments described below should not necessarily be taken as essential requirements for the invention. In the drawings, sections indicated by the same symbols have the same meanings.

1. Display Driver
1.1. Arrangement of High-speed Interface Circuit

FIG. 1 is a diagram showing a display driver 10 (integrated circuit device in a broad sense). The display driver 10 is a narrow integrated circuit in which a short side DH is sufficiently shorter than a long side DW. First to third areas AR1 to AR3 are created by dividing the long side DW of the display driver 10 into three portions in a direction DR1. The first to third areas AR1 to AR3 may be created by equally dividing the long side DW of the display driver 10 into three portions in the direction DR1. A high-speed interface circuit 120 (interface circuit block in a broad sense) is disposed on a second side L2 in the second area AR2 of the display driver 10. The high-speed interface circuit 120 is disposed in the display driver 10 so that the high-speed interface circuit 120 overlaps a center line AR2L which passes through a center point AR2C of the second area AR2 and is in parallel to the direction DR2.

Note that the direction DR1 (first direction in a broad sense) is a direction from a first side L1 to a third side L3 of the display driver 10, the direction DR2 (second direction in a broad sense) is a direction from a fourth side L4 to the second side L2 of the display driver 10, and the direction DR3 (third direction in a broad sense) is a direction from the second side L2 to the fourth side L4 of the display driver 10.

FIG. 2A shows a state in which the display driver 10 is mounted on a glass substrate 11 using the chip on glass (COG) technology. In COG mounting, the chip of the display driver 10 on which gold bumps and the like are formed is directly mounted face-down on the glass substrate 11 of a display panel. This allows the thickness of an LCD module to be reduced to the thickness of the LCD glass.

Figure 2B:
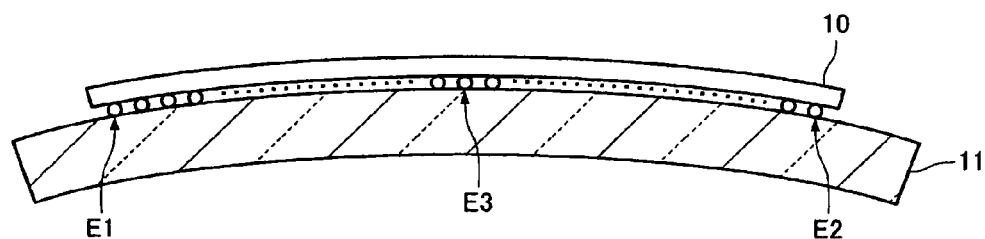
Figure 2C:
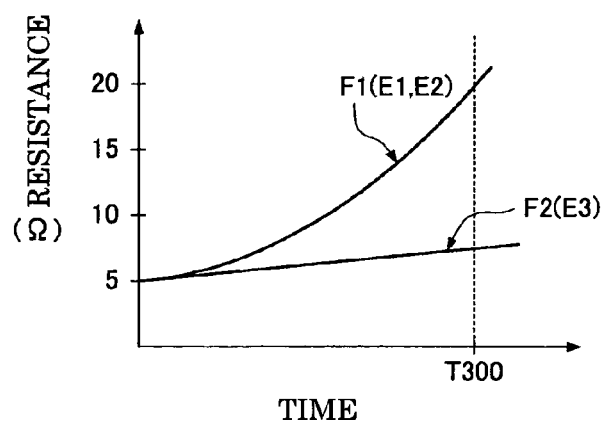

However, a problem occurs in which the contact resistance of the bump is increased on each end of the display driver 10 when mounting the display driver 10 using the COG mounting technology or the like. Specifically, the display driver 10 and the glass substrate 11 have different coefficients of thermal expansion. Therefore, stress (thermal stress) caused by the difference in the coefficient of thermal expansion is greater on the ends of the display driver 10 indicated by E1 and E2 than at the center of the display driver 10 indicated by E3. As a result, the contact resistance of the bump is increased with time on the ends indicated by E1 and E2. As shown in FIG. 2C, when a temperature cycle test corresponding to the change over ten years is performed in 300 cycles, the contact resistance at the center indicated by E3 in FIG. 2B is increased from five ohms to about seven ohms, as indicated by F2 in FIG. 2C. On the other hand, the contact resistance on the ends indicated by E1 and E2 in FIG. 2B is increased to about 20 ohms, as indicated by F1 in FIG. 2C. In particular, the narrower the display driver 10 as shown in FIG. 1, the larger the difference in stress between the ends and the center, and the greater the increase in the contact resistance of the bump on the ends.

In the high-speed interface circuit, the impedance is matched between the transmitter side and the receiver side in order to prevent signal reflection. However, if pads connected with the bumps on the ends of the display driver 10 are used as pads (e.g. DATA+ and DATA−) of the high-speed interface circuit, an impedance mismatch occurs due to an increase in the contact resistance of the bump, as indicated by F1. As a result, the signal quality of high-speed serial transfer deteriorates.

This embodiment can solve the above-described problem since the high-speed interface circuit 120 is disposed in the second area AR2 of the display driver 10, as shown in FIG. 1. This prevents the high-speed interface circuit 120 from being disposed on the ends of the display driver 10. Therefore, an impedance mismatch due to an increase in the contact resistance as indicated by F1 in FIG. 2C can be reduced, whereby deterioration of the signal quality of high-speed serial transfer can be reduced.

In order to minimize an increase in the contact resistance to improve the signal quality, it is preferable that the high-speed interface circuit 120 be disposed so that the high-speed interface circuit 120 overlaps the center line AR2L, as shown in FIG. 1. This allows the high-speed interface circuit 120 to be disposed at or near the center of the display driver 10. Therefore, the contact resistance of the bump or the like has the characteristics indicated by F2 in FIG. 2C, whereby an impedance mismatch due to an increase in the contact resistance can be further reduced.

When an impedance match can be adjusted by the high-speed interface circuit 120 or when it is unnecessary to take into consideration the effects of an impedance mismatch based on a change in the resistance of the bump contact point to a large extent, the high-speed interface circuit 120 may be disposed in the first or third area AR1 or AR3 of the display driver 10.

Input terminals (e.g. pads for DATA+/−, STB+/−, CLK+/−, and power supply) connected with the high-speed interface circuit 120 may be disposed in the area of the display driver 10 on the second side L2. A protection circuit (protection transistor) or the like may be disposed in the area between the input terminals (pads).

1.2. Circuit Configuration of Display Driver

Figure 3:
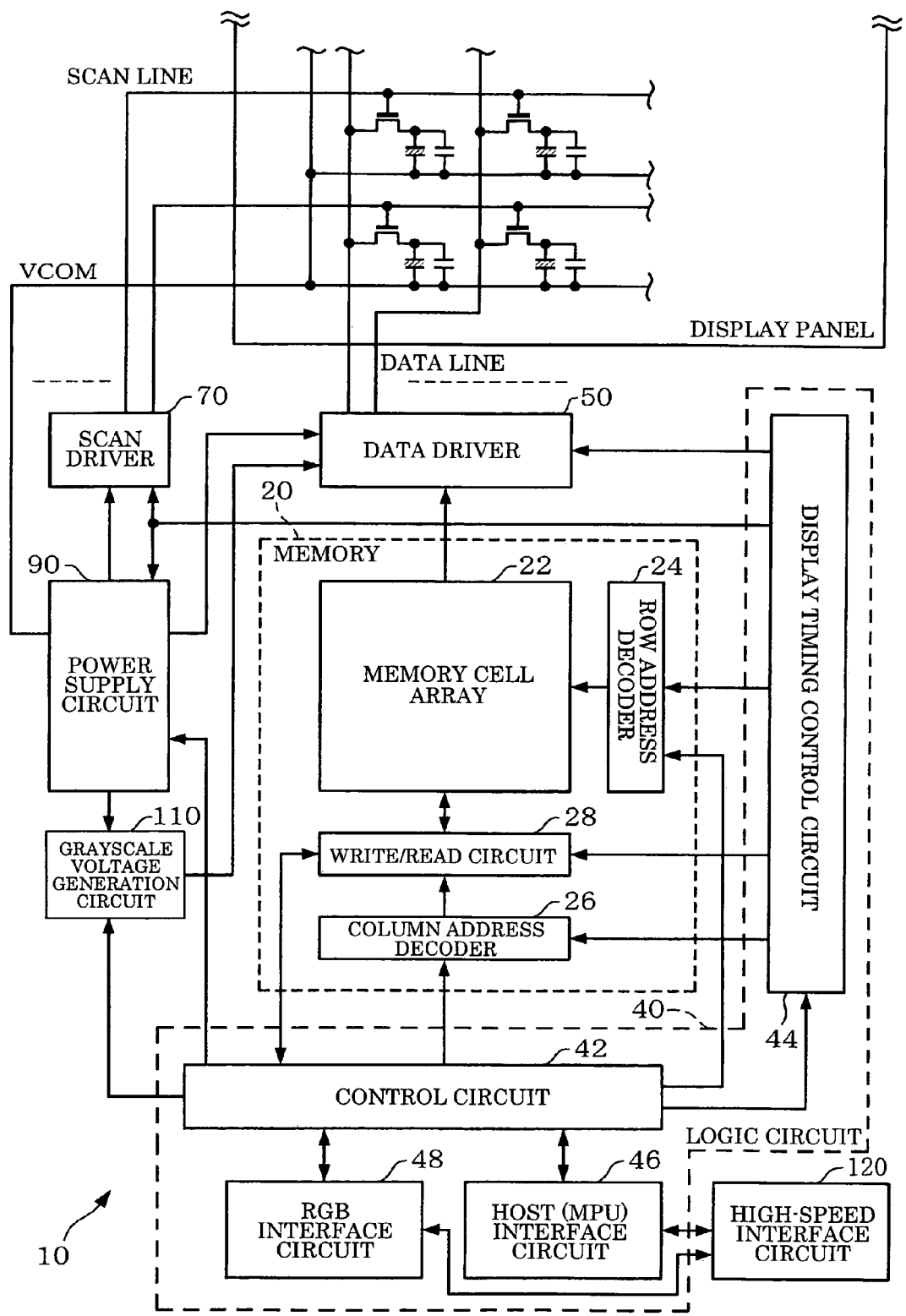
FIG. 3 is a circuit block diagram of a display driver according to one embodiment of the invention.

FIG. 3 shows a circuit configuration example of the display driver 10. Note that the circuit configuration of the display driver 10 is not limited to the configuration shown in FIG. 3. Various modifications and variations may be made. A memory 20 (display data RAM) stores image data. A memory cell array 22 includes a plurality of memory cells and stores image data (display data) of at least one frame (one screen). In this case, one pixel is made up of R, G, and B subpixels (three dots), and six-bit (k-bit) image data is stored corresponding to each subpixel, for example. A row address decoder 24 (MPU/

LCD row address decoder) decodes a row address and selects a wordline of the memory cell array 22. A column address decoder 26 (MPU column address decoder) decodes a column address and selects a bitline of the memory cell array 22. A write/read circuit 28 (MPU write/read circuit) writes image data into the memory cell array 22 or reads image data from the memory cell array 22. The access area of the memory cell array 22 is defined by a quadrilateral having a start address and an end address as opposite vertices. Specifically, the access area is defined by the column address and the row address of the start address and the column address and the row address of the end address so that the memory is accessed.

A logic circuit 40 (automatic placement-routing circuit) generates a control signal for controlling the display timing, a control signal for controlling the data processing timing, and the like. The logic circuit 40 may be formed by automatic placement and routing such as in a gate array (G/A). A control circuit 42 generates various control signals and controls the entire device. In more detail, the control circuit 42 outputs grayscale characteristic (gamma characteristic) adjustment data (gamma correction data) to a grayscale voltage generation circuit 110, or controls voltage generation of a power supply circuit 90. The control circuit 42 also controls write/read processing for the memory using the row address decoder 24, the column address decoder 26, and the write/read circuit 28. A display timing control circuit 44 generates various control signals for controlling the display timing, and controls reading of image data from the memory into the display panel. A host (MPU) interface circuit 46 realizes a host interface for accessing the memory by generating an internal pulse each time accessed from a host. An RGB interface circuit 48 realizes an RGB interface for writing video image RGB data into the memory based on a dot clock signal. The display driver 10 may be configured to include only one of the host interface circuit 46 and the RGB interface circuit 48.

The high-speed interface circuit 120 realizes high-speed serial transfer through a serial bus. In more detail, the high-speed interface circuit 120 realizes high-speed serial transfer between the display driver 10 and the host (host device) by current-driving or voltage-driving differential signal lines of the serial bus.

In FIG. 3, the high-speed interface circuit 120, the host interface circuit 46, and the RGB interface circuit 48 access the memory 20 in pixel units. The image data designated by a line address and read in line units is supplied to a data driver 50 in a line cycle at an internal display timing independent of the high-speed interface circuit 120, the host interface circuit 46, and the RGB interface circuit 48.

The data driver 50 is a circuit for driving data lines of the display panel. In more detail, the data driver 50 receives a plurality of (e.g. 64 stages) grayscale voltages (reference voltages) from the grayscale voltage generation circuit 110, selects the voltage corresponding to digital image data from the grayscale voltages, and outputs the selected voltage as a data voltage.

A scan driver 70 is a circuit for driving scan lines of the display panel. The power supply circuit 90 is a circuit which generates various power supply voltages. The grayscale voltage generation circuit 110 (gamma correction circuit) is a circuit which generates the grayscale voltage.

1.3. Circuit Configuration of High-speed Interface Circuit

Figure 4A:
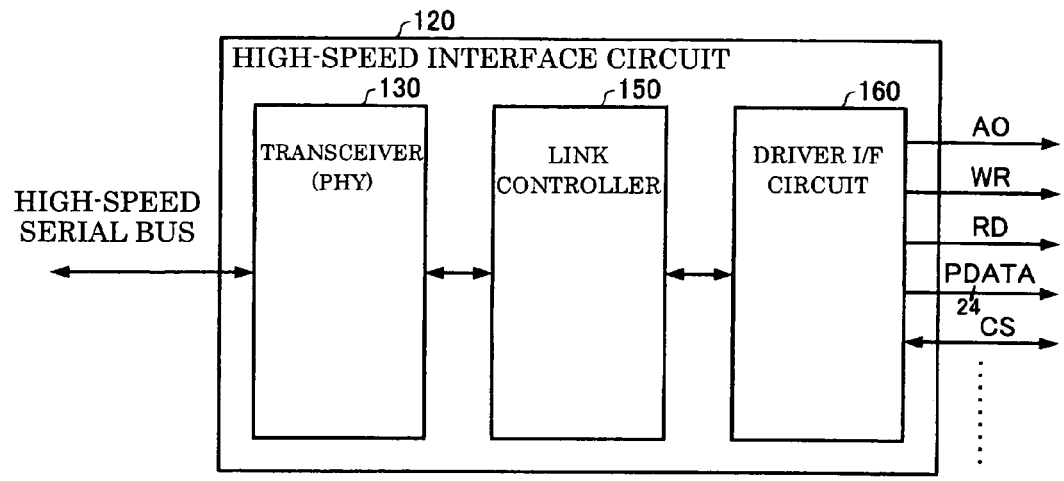
FIGS. 4A and 4B are diagrams showing configuration examples of an interface circuit block according to one embodiment of the invention.

The high-speed interface circuit (serial interface circuit) 120 shown in FIG. 3 is a circuit which transfers data through the serial bus (high-speed serial bus) using differential signals. FIG. 4A shows a configuration example of the high-speed interface circuit 120.

A transceiver 130 is a circuit for receiving or transmitting a packet (command or data) through the serial bus using differential signals (differential data signals, differential strobe signals, and differential clock signals). In more detail, a packet is transmitted or received by current-driving or voltage-driving differential signal lines of the serial bus. The transceiver 130 may include a physical layer circuit (analog front-end circuit) which drives the differential signal lines, a high-speed logic circuit (serial/parallel conversion circuit and parallel/serial conversion circuit), and the like. As the serial bus interface standard, the Mobile Display Digital Interface (MDDI) standard or the like may be employed. The differential signal lines of the serial bus may have a multi-channel configuration. The transceiver 130 includes at least one of a receiver circuit and a transmitter circuit. For example, the transceiver 130 may not include the transmitter circuit.

A link controller 150 performs processing of a link layer or a transaction layer higher than the physical layer. In more detail, when the transceiver 130 has received a packet from the host (host device) through the serial bus, the link controller 150 analyzes the received packet. Specifically, the link controller 150 separates the header and data of the received packet and extracts the header. When transmitting a packet to the host through the serial bus, the link controller 150 generates the packet. In more detail, the link controller 150 generates the header of the packet to be transmitted, and assembles the packet by combining the header and data. The link controller 150 directs the transceiver 130 to transmit the generated packet.

A driver I/F 160 performs interface processing between the high-speed interface circuit 120 and the internal circuit of the display driver. In more detail, the driver I/F circuit 160 generates host interface signals including an address 0 signal A0, a write signal WR, a read signal RD, a parallel data signal PDATA, a chip select signal CS, and the like, and outputs the generated signals to the internal circuit (host interface circuit 46) of the display driver.

In more detail, the transceiver 130 (physical layer circuit) of the high-speed interface circuit 120 shown in FIG. 4A is provided in the high-speed interface circuit 120, and the link controller 150 and the driver I/F circuit 160 as the circuits of the layers (link layer, transaction layer, and application layer) higher than the physical layer are provided in the logic circuit 40. Specifically, only the transceiver 130 is provided in the high-speed interface circuit 120, and the link controller 150 and the driver I/F circuit 160 are provided in an external circuit. This allows the link controller 150 and the driver I/F circuit 160 to be implemented by an automatic placement-routing method such as a gate array, whereby the design efficiency can be increased. Note that part or the entirety of the high-speed logic circuit (e.g. serial/parallel conversion circuit) included in the transceiver 130 may be provided in the logic circuit 40.

Figure 4B:
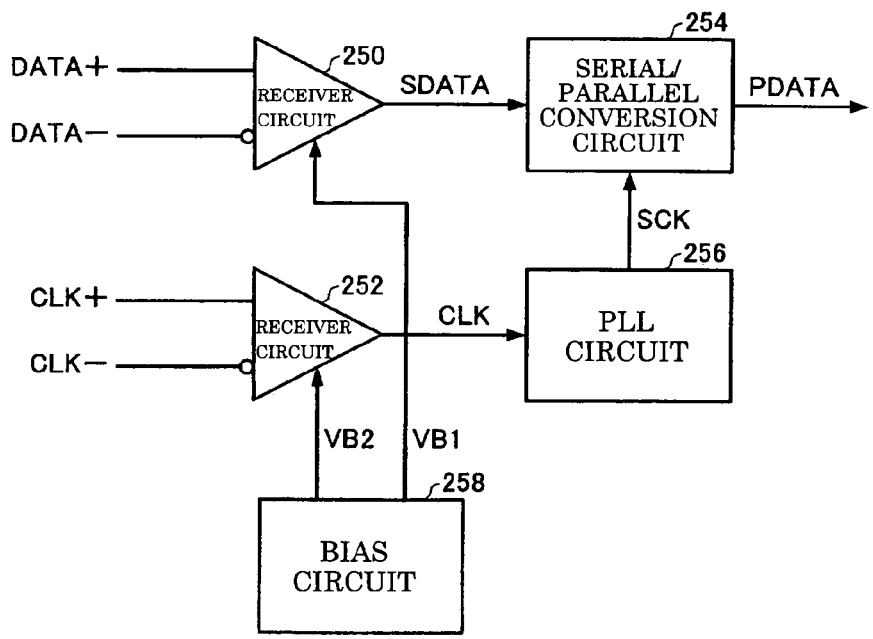

FIG. 4B shows a configuration example of the transceiver 130. A data receiver circuit 250 receives the differential data signals DATA+ and DATA−. The receiver circuit 250 amplifies the voltage generated across a resistor element (not shown) provided between the signal lines for the data signals DATA+ and DATA−, and outputs the resulting serial data SDATA to a serial/parallel conversion circuit 254 in the subsequent stage. A clock signal receiver circuit 252 receives the differential clock signals CLK+ and CLK−. The receiver circuit 252 amplifies the voltage generated across a resistor element (not shown) provided between the signal lines for the clock signals CLK+ and CLK−, and outputs the resulting clock signal CLK to a phase locked loop (PLL) circuit 256 in the subsequent stage. The serial/parallel conversion circuit 254 samples the serial data SDATA from the data receiver circuit 250, converts the serial data SDATA into parallel data PDATA, and outputs the parallel data PDATA. The PLL circuit 256 generates a sampling clock signal SCK for sampling the data received by the data receiver circuit 250 based on the clock signal CLK received by the clock signal receiver circuit 252. In more detail, the PLL circuit 256 outputs multiphase sampling clock signals at the same frequency but with different phases to the serial/parallel conversion circuit 254 as the sampling clock signal SCK. The serial/parallel conversion circuit 254 samples the serial data SDATA using the multiphase sampling clock signals, and outputs the parallel data PDATA. A bias circuit 258 generates bias voltages VB1 and VB2 for controlling a bias current, and supplies the generated bias voltages VB1 and VB2 to the receiver circuits 250 and 252.

Note that the configuration of the transceiver is not limited to the configuration shown in FIG. 4B. Various modifications and variations may be made such as those shown in FIGS. 5A and 5B.

Figure 5A:
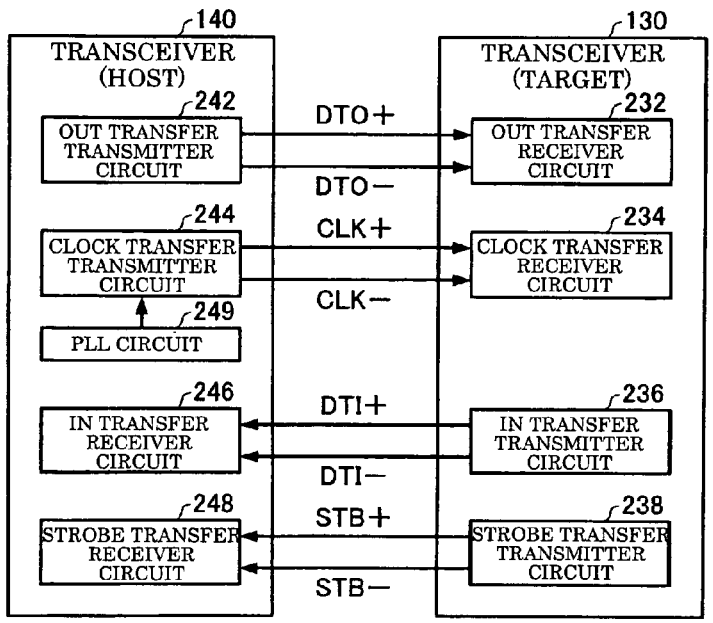
FIGS. 5A to 5C are diagrams showing other configuration examples of an interface circuit block according to one embodiment of the invention.

In a first modification shown in FIG. 5A, DTO+ and DTO− indicate differential data signals (OUT data) output from a host-side transmitter circuit 242 to a target-side receiver circuit 232. CLK+ and CLK− indicate differential clock signals output from a host-side transmitter circuit 244 to a target-side receiver circuit 234. The host side outputs the data signals DTO+/− in synchronization with the edge of the clock signals CLK+/−. Therefore, the target can sample and store the data DTO+/− using the clock signals CLK+/−. In FIG. 5A, the target operates based on the clock signals CLK+/− supplied from the host. Specifically, the clock signals CLK+/− serve as a target-side system clock signal. Therefore, a PLL circuit 249 is provided on the host and is not provided on the target.

DTI+ and DTI− indicate differential data signals (IN data) output from a target-side transmitter circuit 236 to a host-side receiver circuit 246. STB+ and STB− indicate differential strobe signals output from a target-side transmitter circuit 238 to a host-side receiver circuit 248. The target generates and outputs the strobes STB+/− based on the clock signals CLK+/− supplied from the host. The target outputs the data signals DTI+/− in synchronization with the edge of the strobe signals STB+/−. Therefore, the host can sample and store the data signals DTI+/− using the strobes STB+/−.

Figure 5B:
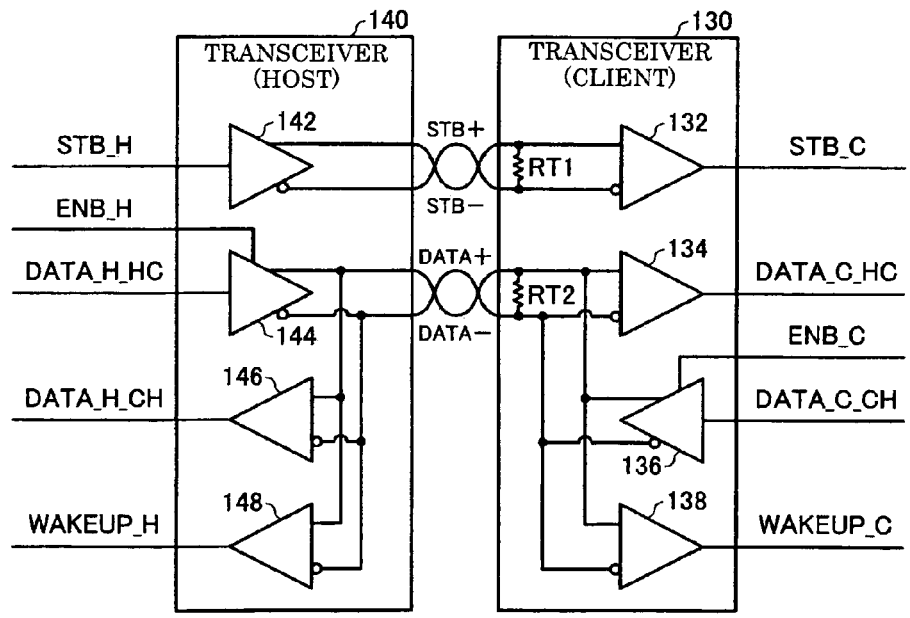
Figure 5C:
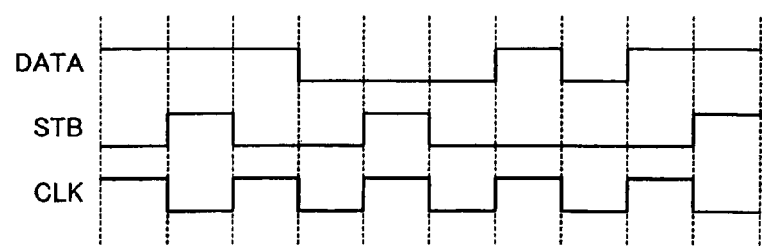

A second modification shown in FIG. 5B is an example of a transceiver conforming to the MDDI standard. In FIG. 5B, a transceiver 140 is provided in the host device, and the transceiver 130 is provided in the display driver. Reference numerals 136, 142, and 144 indicate transmitter circuits, and reference numerals 132, 134, and 146 indicate transmitter circuits. Reference numerals 138 and 148 indicate wakeup detection circuits. The host-side transmitter circuit 142 drives differential strobe signals STB+/−. The client-side receiver circuit 132 amplifies the voltage across a resistor RT1 generated by driving the differential strobe signals STB+/−, and outputs a strobe signal STB_C to the circuit in the subsequent stage. The host-side transmitter circuit 144 drives data signals DATA+/−. The client-side receiver circuit 134 amplifies the voltage across a resistor RT2 generated by driving the data signals DATA+/−, and outputs a data signal DATA_C_HC to the circuit in the subsequent stage. As shown in FIG. 5C, the transmitter side generates a strobe signal STB by calculating the exclusive OR of the data signal DATA and the clock signal CLK, and transmits the strobe signal STB to the receiver side through the high-speed serial bus. The receiver side calculates the exclusive OR of the data signal DATA and the strobe signal STB to reproduce the clock signal CLK.

Figure 6A:
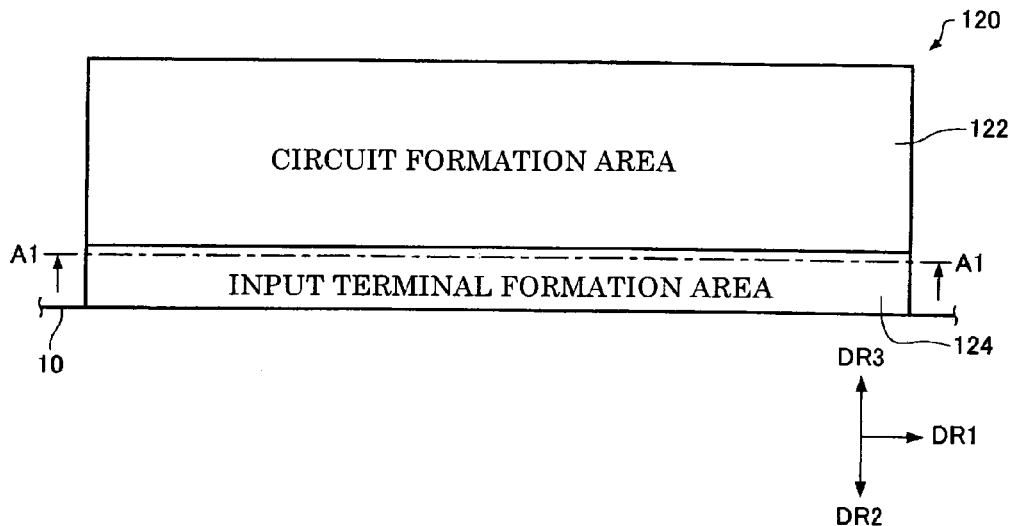
FIGS. 6A to 6C are diagrams showing an input terminal formation area and power supply lines.
Figure 6B:
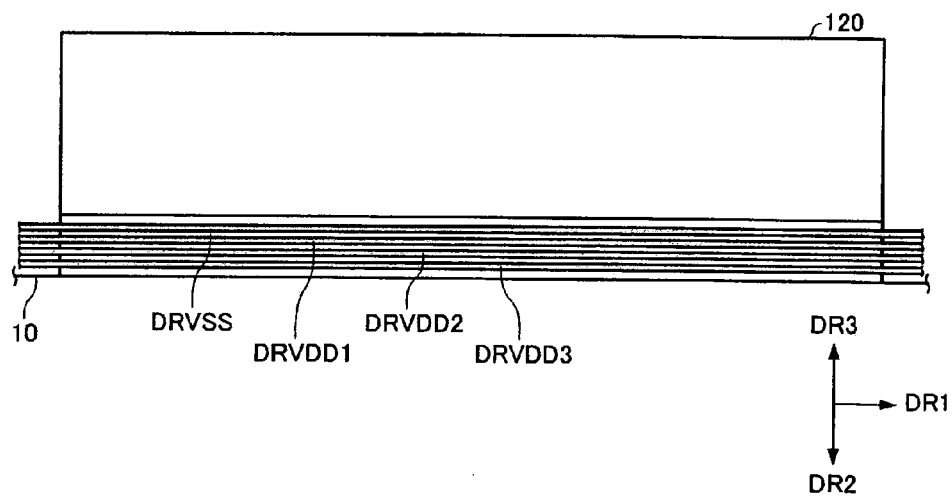
Figure 6C:
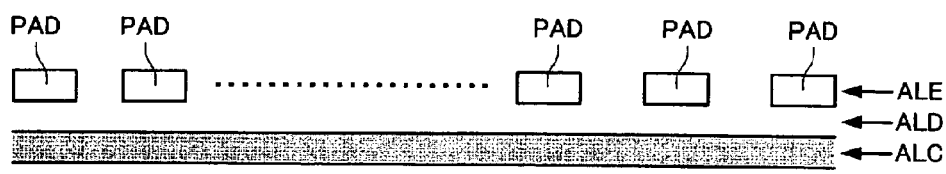

2. Layout Configuration of High-Speed Interface Circuit 2.1. Input Terminal Formation Area and Circuit Formation Area FIGS. 6A to 6C are diagrams showing an input terminal formation area 124 of the high-speed interface circuit 120. As shown in FIG. 6A, in the high-speed interface circuit 120, the input terminal formation area 124 is provided on the second side L2 of the display driver 10, and a circuit formation area 122 is provided on the side of the input terminal formation area 124 in the direction DR3.

In the input terminal formation area 124, a plurality of input terminals connected with the internal circuit of the high-speed interface circuit 120 are disposed along the direction DR1. A receiver circuit which receives differential signals, a bias circuit which supplies a constant voltage to the receiver circuit, and a logic circuit which processes signals from the receiver circuit described later are formed in the circuit formation area 122.

In this embodiment, the high-speed interface circuit 120 is formed using five metal interconnect layers, for example. In this case, the input terminals are formed in the uppermost fifth metal interconnect layer ALE.

As shown in FIG. 6B, a power supply line DRVSS (first power supply line in a broad sense) and power supply lines DRVDD1 to DRVDD3 for the display driver 10 are formed in the input terminal formation area 124, for example. The power supply line DRVSS is a power supply line for supplying a power supply voltage VSS (first power supply voltage in a broad sense) for the display driver 10 inside the display driver 10. Likewise, the power supply lines DRVDD1 to DRVDD3 are power supply lines for supplying power supply voltages (voltages higher than the power supply voltage VSS) necessary for the display driver 10.

The power supply lines DRVSS and DRVDD1 to DRVDD3 are formed to extend along the direction DR1. The power supply line DRVSS is formed in the input terminal formation area 124 on the side of the circuit formation area 122. Since the connection between the power supply line DRVSS and a decoupling capacitor, a protection circuit, and the like described later can be simplified by forming the power supply line DRVSS in the circuit formation area 122 as described above, an efficient layout can be achieved.

The power supply lines DRVSS and DRVDD1 to DRVDD3 are formed in the lower layer of the input terminals PAD. The power supply lines DRVSS and DRVDD1 to DRVDD3 are formed in a third metal interconnect layer ALC, as shown in FIG. 6C. Note that the layer in which the power supply lines DRVSS and DRVDD1 to DRVDD3 are formed is not limited thereto. The power supply lines DRVSS and DRVDD1 to DRVDD3 may be formed in a second metal interconnect layer ALB, for example.

2.2. Layout of Each Circuit

Figure 7:
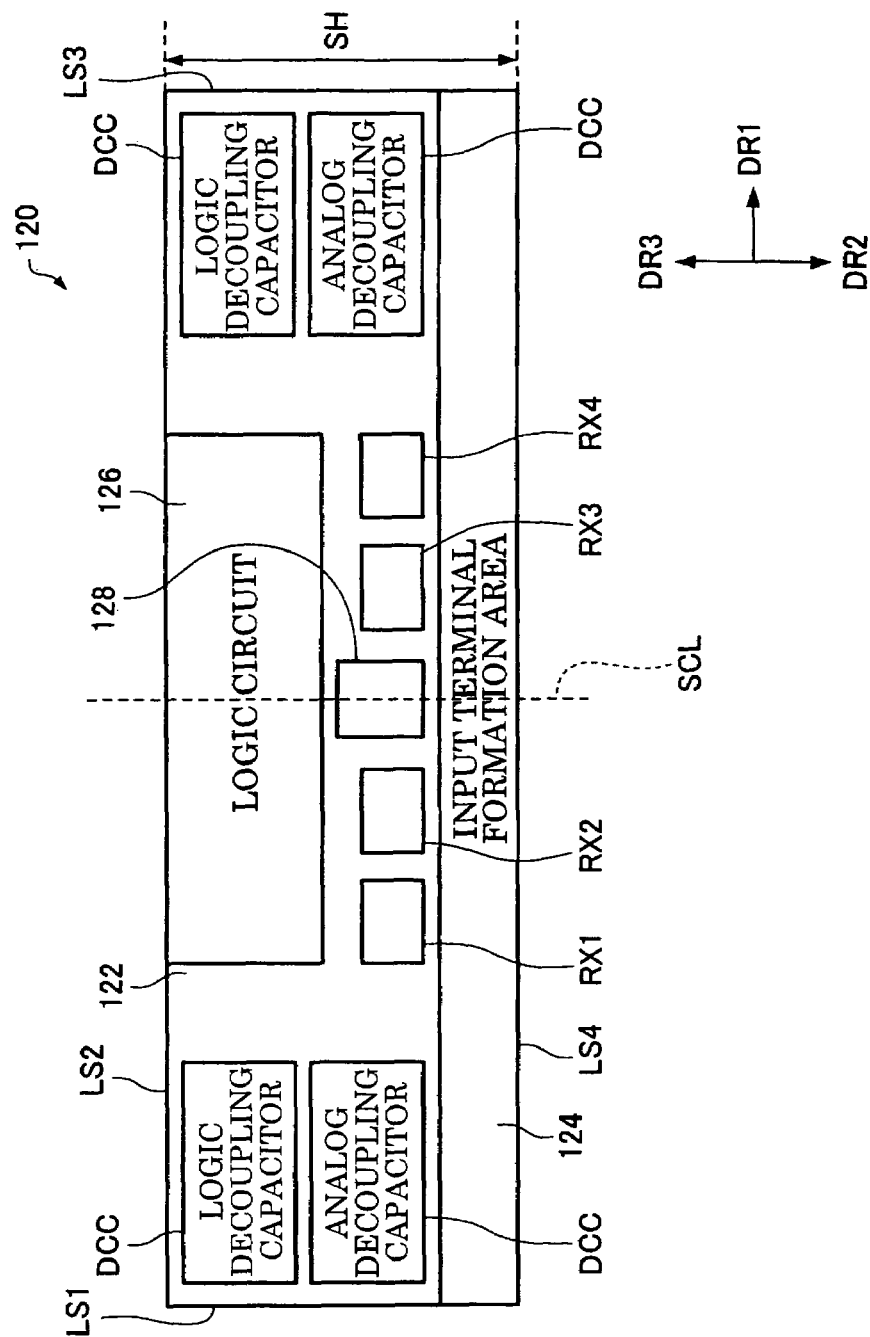
FIG. 7 is a diagram showing an example of the circuit layout of an interface circuit block according to one embodiment of the invention.

FIG. 7 is a diagram showing the layout of each circuit of the high-speed interface circuit 120. As shown in FIG. 7, decoupling capacitors DCC are provided on a first side LS1 and a third side LS3 of the high-speed interface circuit 120. The decoupling capacitor DCC is connected with the power supply line DRVSS as described later to allow the power supply voltage of the high-speed interface circuit 120 to be stabilized even if the power supply system of the high-speed interface circuit 120 is affected by noise from the power supply lines DRVDD1 to DRVDD3 of the display driver 10, for example. It is preferable to provide an analog decoupling capacitor and a logic decoupling capacitor as the decoupling capacitors DCC. Noise propagation between the analog circuit and the logic circuit (digital circuit) can be reduced by separately providing the analog decoupling capacitor and the logic (digital) decoupling capacitor. Note that the area in which the decoupling capacitor DCC is provided is not limited to the area shown in FIG. 7. The decoupling capacitor DCC may be provided in an arbitrary space area in the circuit formation area 122. The power supply in the high-speed interface circuit 120 is stabilized as the capacitance of the decoupling capacitor DCC becomes larger.

A bias circuit 128 is provided in the circuit formation area 122 so that the bias circuit 128 overlaps a center line SCL. The bias circuit 128 is a circuit which supplies a constant voltage to receiver circuits RX1 to RX4 (first to Sth receiver circuits in a broad sense), and corresponds to the bias circuit 258 shown in FIG. 4B, for example.

The receiver circuits RX1 to RX4 are disposed on either side of the bias circuit 128 along the direction DR1. The receiver circuits RX1, RX3, and RX4 correspond to the receiver circuit 250 shown in FIG. 4B, and the receiver circuit RX2 corresponds to the receiver circuit 252 shown in FIG. 4B, for example.

The center line SCL is the center line of the high-speed interface circuit 120 which is parallel to the direction DR2 and passes through the midpoint of the second side LS2 (or fourth side LS4) of the high-speed interface circuit 120. A constant voltage can be equally supplied to the receiver circuits RX1 to RX4 by disposing the bias circuit 128 at the center of the high-speed interface circuit 120. This reduces the difference in the interconnection length between the receiver circuits RX1 to RX4 and the bias circuit 128, whereby a signal delay caused by the difference in the interconnection length, variation in the supply voltage caused by the difference in the wiring resistance, and the like can be reduced. Specifically, a high-speed interface circuit 120 exhibiting excellent signal characteristics can be realized.

A logic circuit 126 is provided on the side of the receiver circuits RX1 to RX4 and the bias circuit 128 in the direction DR3. The logic circuit 126 processes signals from the receiver circuits RX1 to RX4 and supplies the processed signals to the upper layer circuit (e.g. link controller 150).

The length SH of the short side of the high-speed interface circuit 120 can be reduced by arranging each circuit as shown in FIG. 7.

2.3. Input Terminal Formation Area and Protection Circuit

Figure 8A:
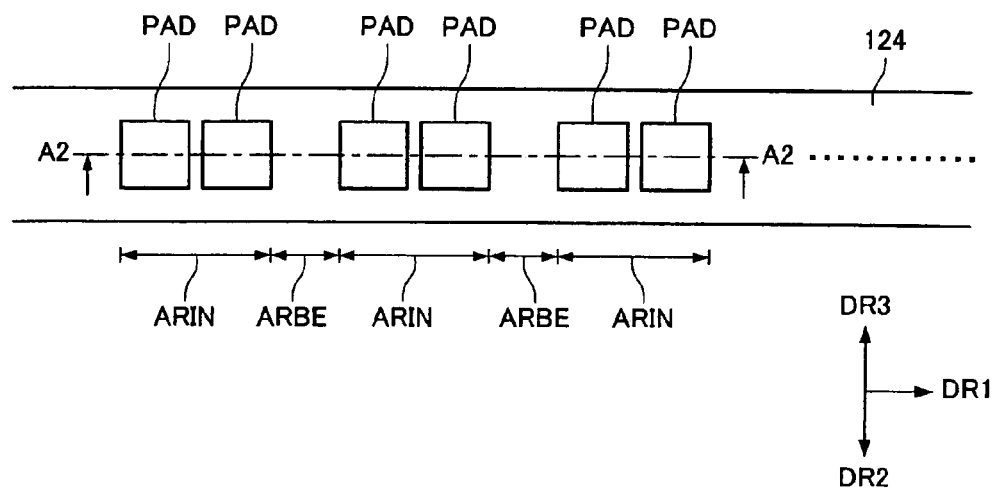
FIGS. 8A and 8B are diagrams showing an input terminal-to-input terminal area and an input terminal arrangement area of an interface circuit block according to one embodiment of the invention.

FIG. 8A shows part of the input terminal formation area 124. The input terminals PAD are disposed along the direction DR1. In this embodiment, two input terminals PAD are used to receive one signal, for example. The structure (double pad) in which one signal is received using two input terminals PAD increases the width in the direction DR1 of an input terminal arrangement area ARIN in which two input terminals PAD are disposed. This facilitates contact of a probe card during product inspection or the like, whereby the inspection efficiency is expected to be increased. Moreover, since the width of the input terminal arrangement area ARIN is large in the direction DR1, two or more inspection probes can be caused to come in contact with the input terminals during product inspection. Therefore, the measurement accuracy can be improved by using a four terminal measurement method or the like.

An input terminal-to-input terminal area ARBE is provided between the input terminal arrangement areas ARIN. The input terminal-to-input terminal area ARBE is an area in which the input terminal PAD is not formed. A protection circuit ESD (protection circuit in a broad sense) is formed in a semiconductor layer in the lower layer in the input terminal-to-input terminal area ARBE.

Since the protection circuit ESD can be formed in the input terminal formation area 124, the circuit formation area 122 can be effectively utilized, whereby the layout area of the high-speed interface circuit 120 can be reduced.

Figure 8B:
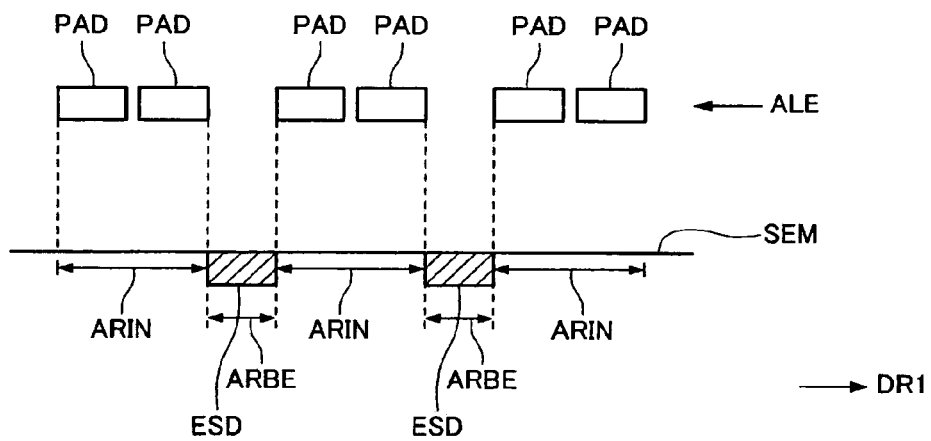

FIG. 8B shows the cross section along the line A2-A2 shown in FIG. 8A. The input terminals PAD are formed in the fifth metal interconnect layer ALE, for example. In a semiconductor layer SEM lower than the fifth metal interconnect layer ALE, the protection circuit ESD is not formed in the area lower than the input terminals PAD (i.e. the semiconductor layer SEM in the input terminal arrangement area ARIN).

As shown in FIG. 8B, the protection circuit ESD is formed in the semiconductor layer SEM in the input terminal-to-input terminal area ARBE (i.e. area in which the input terminal PAD is not formed).

For example, when mounting the display driver 10 by COG using bumps (also called "bump product"), since the interconnect layer in the lower layer of the input terminal PAD is not used, the interconnect layer can be arbitrarily used. Specifically, the protection circuit ESD can be formed in the semiconductor layer SEM in the lower layer of the input terminal PAD.

On the other hand, when mounting the display driver 10 on a substrate by wire bonding or the like (also called "pad product"), since the lower layer of the input terminal PAD makes up the structure of the input terminal PAD, the interconnect layer in the lower layer of the input terminal PAD cannot be utilized. Therefore, the protection circuit ESD cannot be formed in the semiconductor layer SEM in the input terminal arrangement area ARIN.

In this embodiment, the protection circuit ESD is formed in the semiconductor layer SEM in the input terminal-to-input terminal area ARBE, and is not formed in the semiconductor layer SEM in the input terminal arrangement area ARIN. The high-speed interface circuit macro for forming the high-speed interface circuit 120 according to this embodiment can be applied to the bump product display driver 10 and the pad product display driver 10 by employing the above-described circuit layout. Specifically, since the high-speed interface circuit macro can be supplied without designing the high-speed interface circuit 120 corresponding to the mounting form of the display driver 10, the design cost can be reduced.

2.4. Type and Arrangement of Input Terminal

Figure 9:
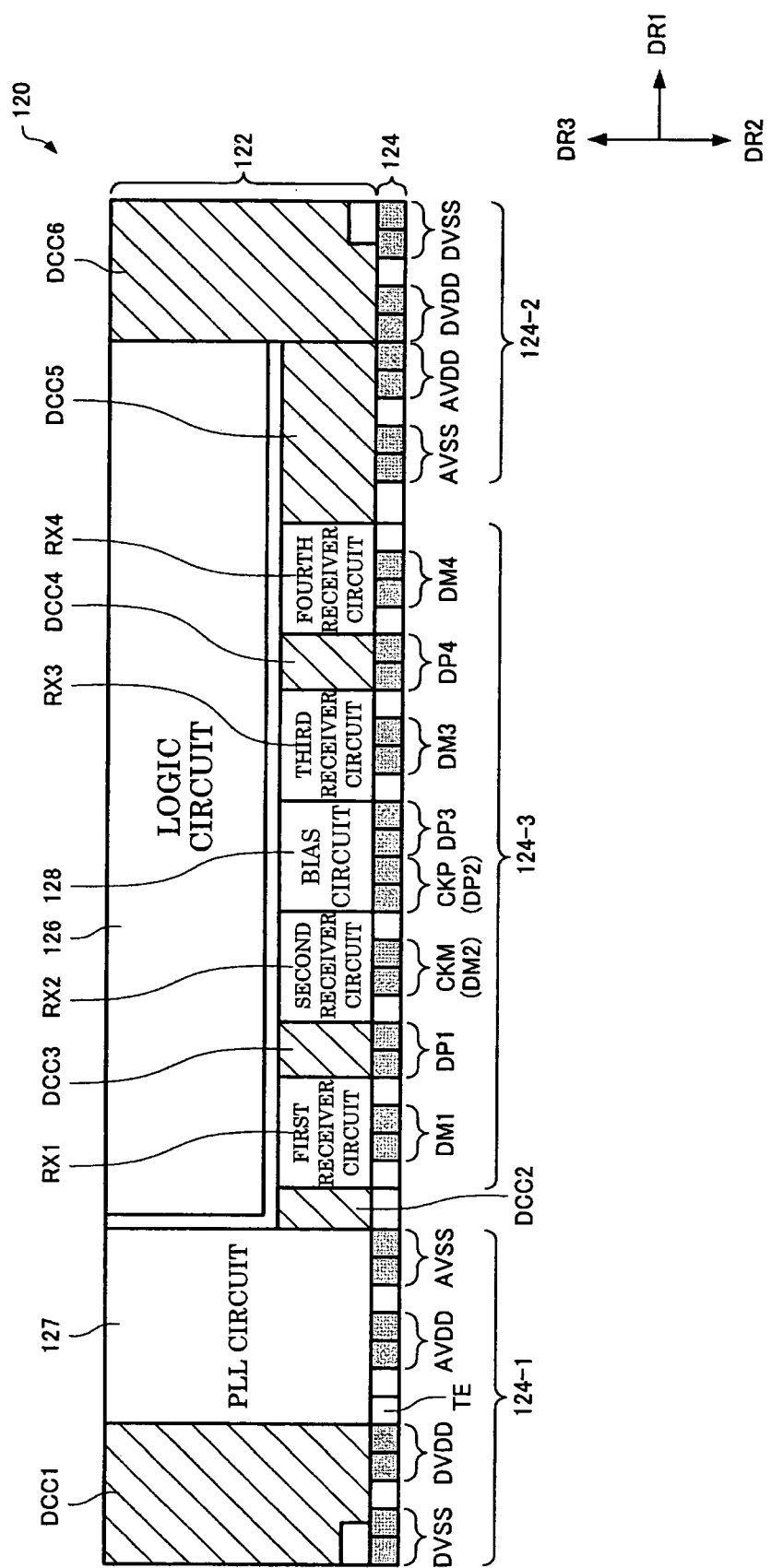
FIG. 9 is a diagram showing an arrangement example of each input terminal of an interface circuit block according to one embodiment of the invention.

FIG. 9 is a diagram showing the detailed layout of the high-speed interface circuit 120. Although the input terminals are closely provided in FIG. 9 for convenience, the input terminals are separated to some extent. This also applies to FIG. 10. The input terminal formation area 124 includes first and second power supply input terminal formation areas 124-1 and 124-2 in which logic power supply voltage input terminals DVSS (first power supply input terminal in a broad sense) and DVDD (second power supply input terminal in a broad sense) and analog power supply voltage input terminals AVDD (second power supply input terminal in a broad sense) and AVSS (first power supply input terminal in a broad sense) for supplying the power supply voltages VDD (second power supply voltage in a broad sense) and VSS (first power supply voltage in a broad sense) to the high-speed interface circuit 120 are disposed. In the first and second power supply input terminal formation areas 124-1 and 124-2, the logic power supply voltage input terminals DVSS and DVDD and the analog power supply voltage input terminals AVDD and AVSS are disposed in that order along the direction DR1.

The input terminal formation area 124 includes a differential signal input terminal formation area 124-3 in which differential signal input terminals DM1 to DM4 and DP1 to DP4 for supplying differential signals to the high-speed interface circuit 120 are disposed.

The differential signal input terminals DM1 and DPI are connected with the receiver circuit RX1, and the differential signal input terminals CKM (DM2) and CKP (DP2) are connected with the receiver circuit RX2. The receiver circuit RX2 receives a clock signal supplied using differential signals. Note that another receiver circuit may receive the clock signal.

The differential signal input terminals DM3 and DP3 correspond to the receiver circuit RX3, and the differential signal input terminals DM4 and DP4 correspond to the receiver circuit RX4.

As shown in FIG. 9, the differential signal input terminal formation area 124-3 is provided between the first and second power supply input terminal formation areas 124-1 and 124-2 in the direction DR1.

The voltages supplied to the logic power supply voltage input terminals DVSS and DVDD are supplied to the logic circuit 126, for example. The voltage VSS is supplied to the logic power supply voltage input terminal DVSS, and the voltage VDD is supplied to the logic power supply voltage input terminal DVDD, for example.

The voltages supplied to the analog power supply voltage input terminals AVDD and AVSS are supplied to the bias circuit 128 and a PLL circuit 127, for example. The voltage VDD is supplied to the analog power supply voltage input terminal AVDD, and the voltage VSS is supplied to the analog power supply voltage input terminal AVSS, for example.

The PLL circuit 127 multiplies the frequency of the clock signal supplied to the high-speed interface circuit 120 using differential signals, and corresponds to the PLL circuit 256 shown in FIG. 4B, for example.

Space areas are formed as indicated by DCC1 to DCC6 by disposing the receiver circuits RX1 to RX4, the logic circuit 126, the PLL circuit 127, and the bias circuit 128 in the circuit formation area 122. The decoupling capacitors DCC are formed by utilizing these areas. An efficient layout can be achieved by effectively utilizing the space areas. Moreover, since the capacitance of the decoupling capacitor DCC can be increased by using a space area, the power supply in the high-speed interface circuit 120 can be stabilized.

A test terminal TE is used when testing the high-speed interface circuit 120, and may be omitted from the high-speed interface circuit 120.

2.5. Arrangement of Protection Circuit

Figure 10:
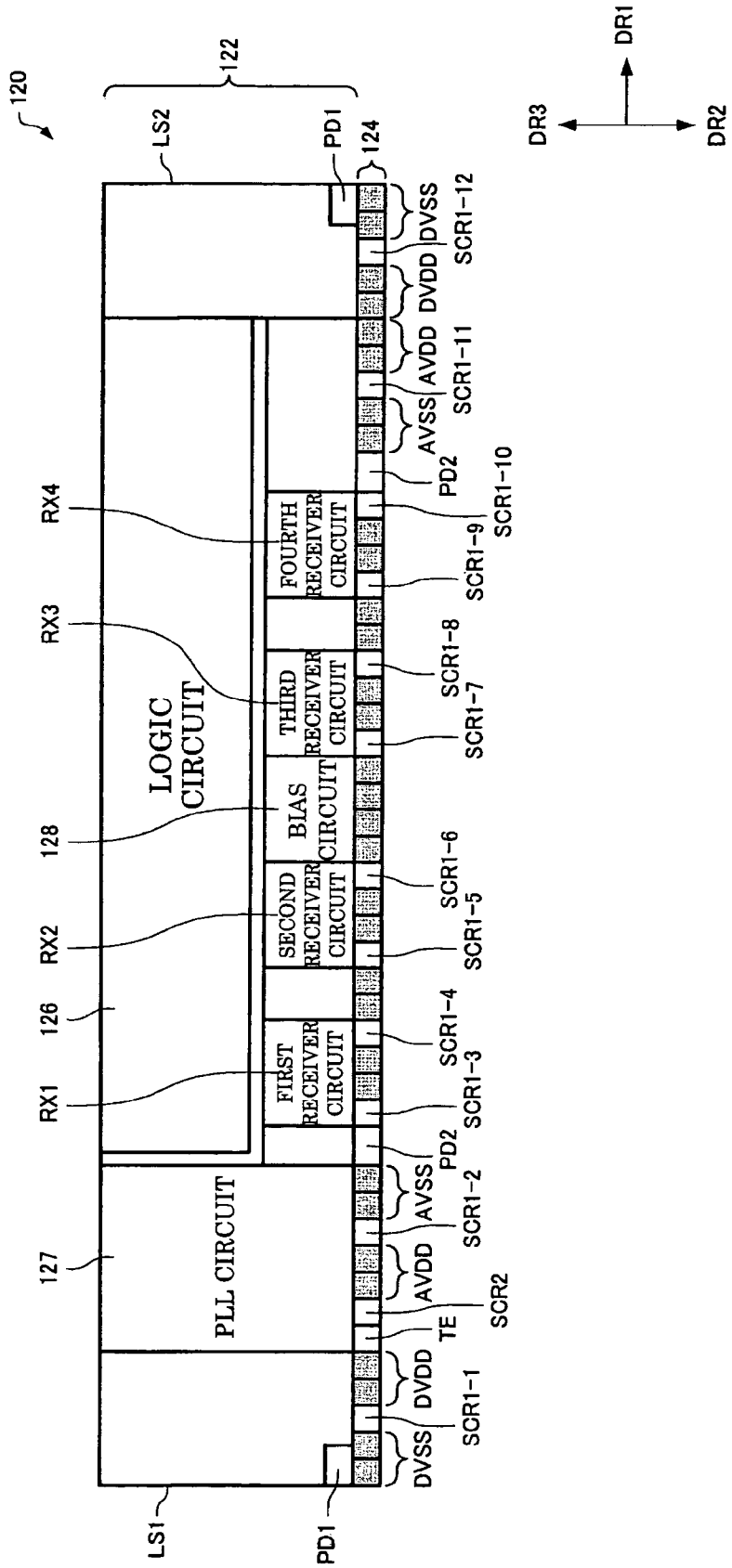
FIG. 10 is a diagram showing an arrangement example of each input terminal of an interface circuit block according to one embodiment of the invention.

FIG. 10 is a diagram showing the arrangement of a protection circuit PD1 (first protection circuit in a broad sense), a protection circuit PD2 (second protection circuit in a broad sense), and protection circuits SCR1-1 to SCR1-12 and SCR2. The protection circuit PD2 and the protection circuits SCR1-1 to SCR1-12 and SCR2 correspond to the protection circuit ESD.

The protection circuits PD1 are respectively provided in the circuit formation area 122 on the first side LS1 and the third side LS3 of the high-speed interface circuit 120 and on the side of the logic power supply voltage input terminals DVSS in the direction DR3.

The protection circuits PD2 are respectively formed in the input terminal formation area 124 in the semiconductor layer in the input terminal-to-input terminal area ARBE adjacent to the analog power supply voltage input terminal AVSS.

The protection circuits SCR1-1 and SCR1-12 are respectively formed in the semiconductor layer in the input terminal-to-input terminal area ARBE adjacent to the logic power supply voltage input terminal DVDD. The protection circuits SCR1-2 and SCR1-11 are respectively formed in the semiconductor layer in the input terminal-to-input terminal area ARBE adjacent to the analog power supply voltage input terminal AVDD. The protection circuits SCR1-3 to SCR1-10 are respectively formed in the semiconductor layer in the input terminal-to-input terminal area ARBE adjacent to the differential signal input terminals DM1 to DM4 and DP1 to DP4. The protection circuit SCR2 is formed in the semiconductor layer in the input terminal-to-input terminal area ARBE adjacent to the test terminal TE.

Since the power supply line DRVSS for the display driver 10 is formed in the third metal interconnect layer ALC in the input terminal formation area 124, the power supply line DRVSS can be easily connected with each protection circuit.

3. Protection Circuit 3.1. Thyristor

Figure 11A:
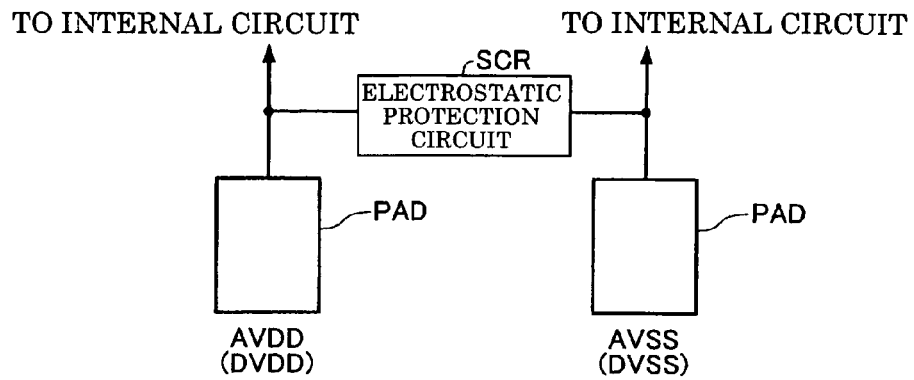
FIGS. 11A to 11C are diagrams showing the connection between each input terminal and a protection circuit.
Figure 11B:
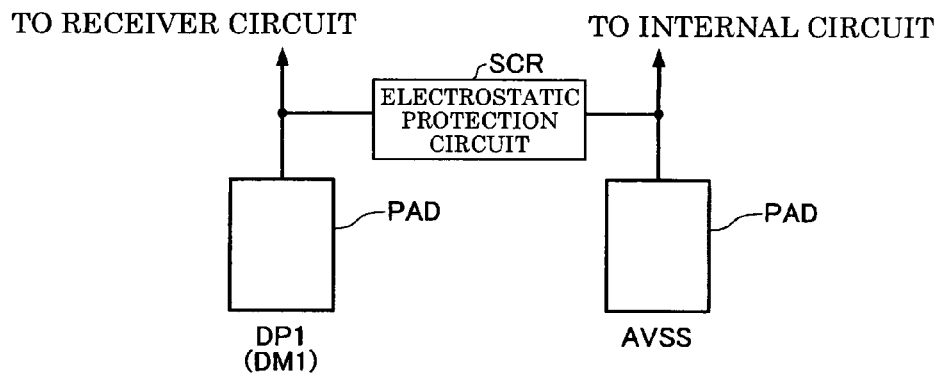
Figure 11C:
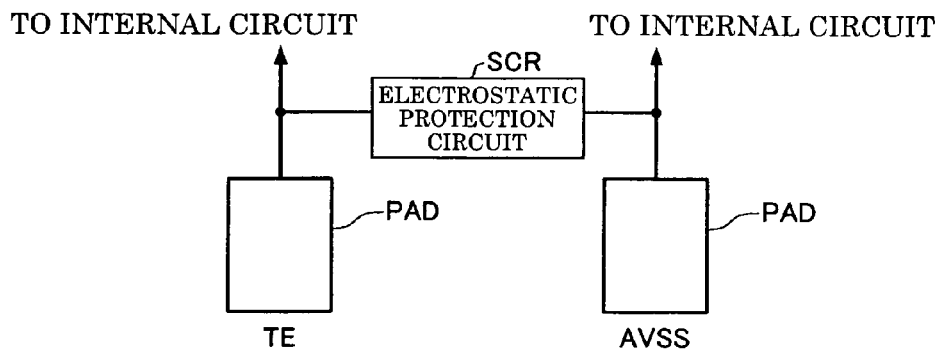

FIGS. 11A to 11C are diagrams showing the connection relationship between the protection circuit SCR, which corresponds to each of the protection circuits SCR1-1 to SCR1-12 and SCR2 shown in FIG. 10, and each input terminal. The protection circuit SCR may be formed by a thyristor, for example.

As shown in FIG. 11A, the protection circuit SCR connects the analog power supply voltage input terminal AVDD (or, logic power supply voltage input terminal DVDD) with the analog power supply voltage input terminal AVSS (or, logic power supply voltage input terminal DVSS). The analog power supply voltage input terminal AVDD (or, logic power supply voltage input terminal DVDD) and the analog power supply voltage input terminal AVSS (or, logic power supply voltage input terminal DVSS) are connected with the internal circuit.

For example, when an unexpected high voltage is supplied to the analog power supply voltage input terminal AVDD (or, logic power supply voltage input terminal DVDD), the protection circuit SCR is turned ON, whereby the high voltage is supplied to the analog power supply voltage input terminal AVSS (or, logic power supply voltage input terminal DVSS). This protects the internal circuit against the high voltage.

The protection circuit SCR shown in FIG. 11A corresponds to the protection circuits SCR1-1, SCR1-2, SCR1-11, and SCR1-12 shown in FIG. 10, for example. The effect of preventing an unexpected high voltage from propagating to the internal circuit is increased by providing the protection circuit SCR near the analog power supply voltage input terminal AVDD (or, logic power supply voltage input terminal DVDD) and the analog power supply voltage input terminal AVSS (or, logic power supply voltage input terminal DVSS).

As shown in FIG. 11B, the protection circuit SCR connects the differential signal input terminal DM1 (or, differential signal input terminals DM2 to DM4 or DP1 to DP4) with the analog power supply voltage input terminal AVSS. The differential signal input terminal DM1 is connected with the receiver circuit RX1, and the analog power supply voltage input terminal AVSS (or, logic power supply voltage input terminal DVSS) is connected with the internal circuit.

For example, when an unexpected high voltage is supplied to the differential signal input terminal DM1 (or, differential signal input terminals DM2 to DM4 or DP1 to DP4), the protection circuit SCR is turned ON, whereby the high voltage is supplied to the analog power supply voltage input terminal AVSS (or, logic power supply voltage input terminal DVSS). This protects the receiver circuit against the high voltage. The protection circuit SCR shown in FIG. 11B corresponds to the protection circuits SCR1-3 to SCR1-10 shown in FIG. 10, for example. The effect of preventing an unexpected high voltage from propagating to the internal circuit is increased by providing the protection circuit SCR near the differential signal input terminal DM1 (or, differential signal input terminals DM2 to DM4 or DP1 to DP4) and the analog power supply voltage input terminal AVSS.

As shown in FIG. 11C, the protection circuit SCR connects the test terminal TE with the analog power supply voltage input terminal AVSS. The test terminal TE and the analog power supply voltage input terminal AVSS (or, logic power supply voltage input terminal DVSS) are connected with the internal circuit.

For example, when an unexpected high voltage is supplied to the test terminal TE, the protection circuit SCR is turned ON, whereby the high voltage is supplied to the analog power supply voltage input terminal AVSS (or, logic power supply voltage input terminal DVSS). This protects the internal circuit against the high voltage.

The protection circuit SCR shown in FIG. 11C corresponds to the protection circuit SCR2 shown in FIG. 10, for example. The effect of preventing an unexpected high voltage from propagating to the internal circuit is increased by providing the protection circuit SCR near the test terminal TE and the analog power supply voltage input terminal AVSS (or, logic power supply voltage input terminal DVSS).

Figure 12:
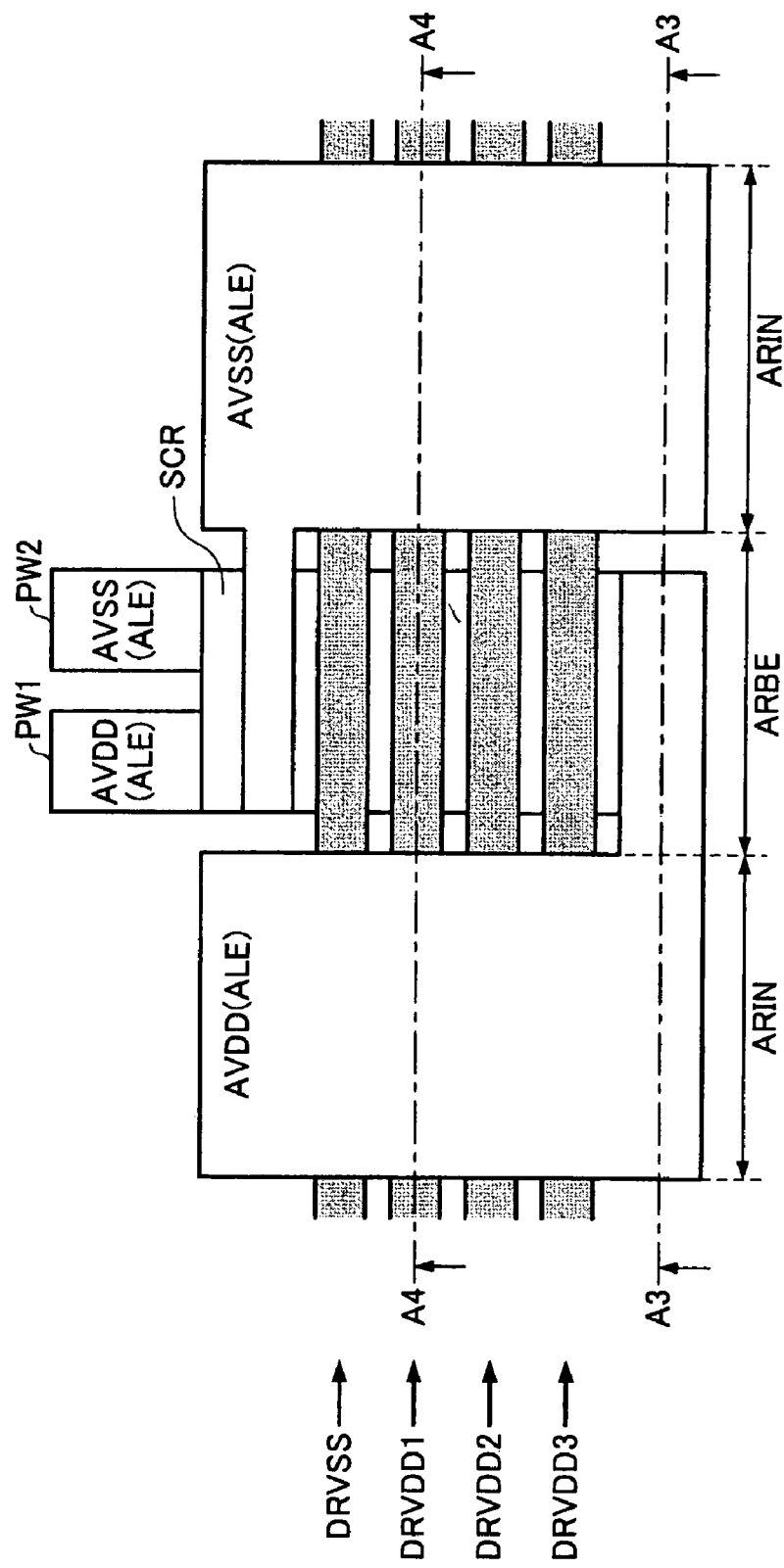
FIG. 12 is a diagram showing input terminals of an interface circuit block and power supply lines according to one embodiment of the invention.

FIG. 12 is an enlarged diagram of the analog power supply voltage input terminal AVDD and the analog power supply voltage input terminal AVSS. The input terminals AVDD and AVSS are formed in the fifth metal interconnect layer ALE, for example. The power supply lines DRVSS and DRVDD1 to DRVDD3 for the display driver 10 are formed in the third metal interconnect layer ALC lower than the fifth metal interconnect layer ALE, for example.

The protection circuit SCR is formed in the semiconductor layer in the input terminal-to-input terminal area ARBE. The analog power supply voltage input terminal AVDD is connected with the protection circuit SCR, and is connected with the analog power supply voltage input terminal AVSS through the protection circuit SCR. The analog power supply voltage input terminal AVDD is connected with the semiconductor layer in the input terminal-to-input terminal area ARBE, and is connected with a voltage supply terminal PW1 without going through the protection circuit SCR. The voltage supply terminal PW1 is formed in the fifth metal interconnect layer ALE, for example. This allows the voltage (e.g. voltage VDD) supplied to the analog power supply voltage input terminal AVDD to be supplied to the voltage supply terminal PW1 when the protection circuit SCR is not turned ON.

Likewise, the analog power supply voltage input terminal AVSS is connected with the protection circuit SCR, and is connected with the analog power supply voltage input terminal AVDD through the protection circuit SCR. The analog power supply voltage input terminal AVSS is connected with the semiconductor layer in the input terminal-to-input terminal area ARBE, and is connected with a voltage supply terminal PW2 without going through the protection circuit SCR. The voltage supply terminal PW2 is formed in the fifth metal interconnect layer ALE, for example. This allows the voltage (e.g. voltage VSS) supplied to the analog power supply voltage input terminal AVSS to be supplied to the voltage supply terminal PW2 when the protection circuit SCR is not turned ON.

Figure 13A:
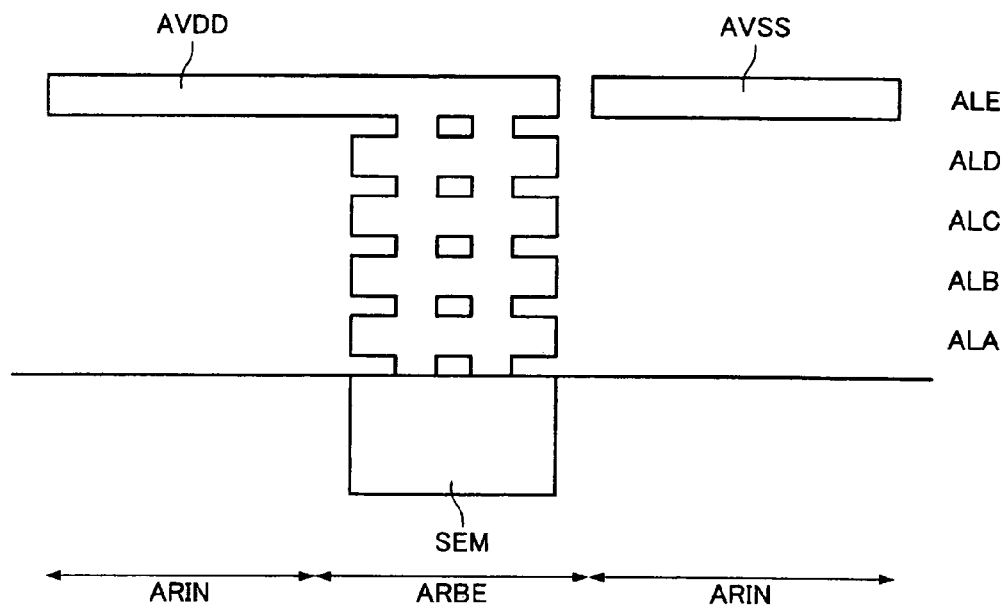
FIG. 13A is a cross-sectional diagram along the line A3-A3 shown in FIG. 12.

FIG. 13A is a diagram showing the cross section along the line A3-A3 shown in FIG. 12. The analog power supply voltage input terminal AVDD is connected with the semiconductor layer SEM in the input terminal-to-input terminal area ARBE using the metal interconnect layers ALE to ALA in the input terminal-to-input terminal area ARBE.

Figure 13B:
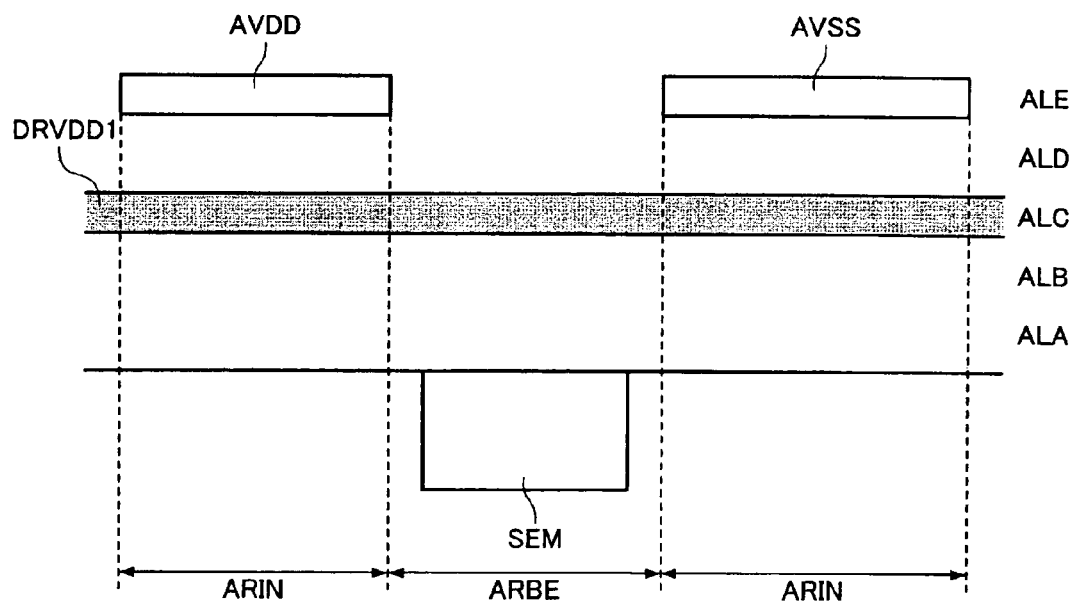
FIG. 13B is a cross-sectional diagram along the line A4-A4 shown in FIG. 12.

FIG. 13B is a diagram showing the cross section along the line A4-A4 shown in FIG. 12. The power supply line DRVDD1 for the display driver 10 is formed in the third metal interconnect layer ALC in the lower layer of the input terminals AVDD and AVSS.

Figure 14A:
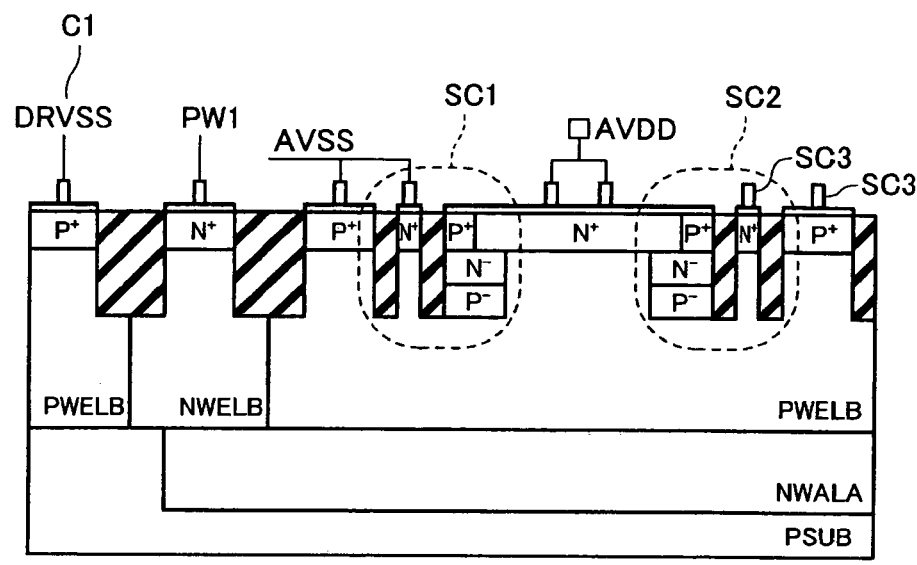
FIGS. 14A and 14B are diagrams showing a configuration example of a protection circuit.

FIG. 14A is a cross-sectional diagram showing an example of the protection circuit SCR used in the high-speed interface circuit 120 according to this embodiment. Two thyristors are formed as indicated by SC1 and SC2 shown in FIG. 14A. Note that the number of thyristors is not limited thereto. Only one thyristor may be formed. The number of thyristors used can be determined when forming a metal interconnect by forming two thyristors as shown in FIG. 14A. For example, when it is desired to increase the breakdown voltage, portions indicated by SC3 are interconnected to connect the thyristors in parallel.

The analog power supply voltage input terminal AVDD is connected with the analog power supply voltage input terminal AVSS through the thyristor indicated by SC1, for example. The analog power supply voltage input terminal AVDD is connected with the voltage supply terminal PW1 through the semiconductor layer instead of the thyristor. The power supply line DRVSS for the display driver 10 is connected with a diffusion region PWELB, as indicated by C1.

Figure 14B:
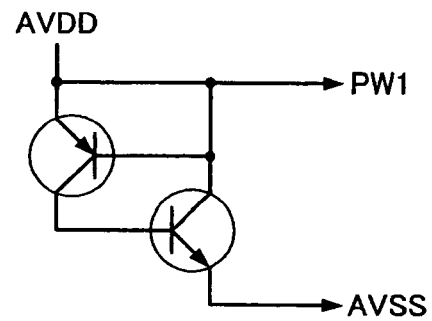

FIG. 14B is a simplified circuit diagram illustrative of the protection circuit SCR. The thyristor is turned ON when a high voltage is supplied to the analog power supply voltage input terminal AVDD, whereby the high voltage is not supplied to the voltage supply terminal PW1 but is supplied to the analog power supply voltage input terminal AVSS. This protects the internal circuit against the high voltage.

3.2. Bidirectional Diode 3.2.1. First Protection Circuit

Figure 15A:
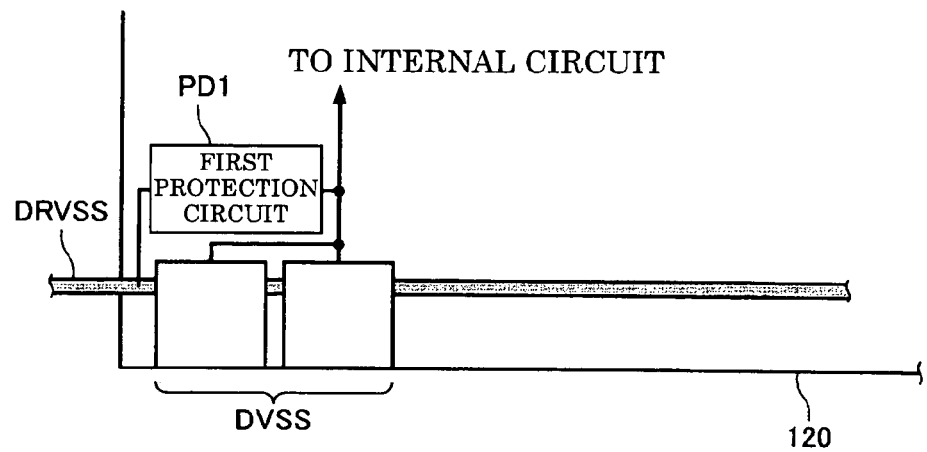
FIGS. 15A to 15C are diagrams showing the connection between each input terminal and a protection circuit.

As shown in FIG. 10, the protection circuits PD1 are provided in the circuit formation area 122 on the first side LS1 and the third side LS3 of the high-speed interface circuit 120 and on the side of the logic power supply voltage input terminals DVSS in the direction DR3. FIG. 15A shows the protection circuit PD1 provided on the first side LS1.

Figure 15B:
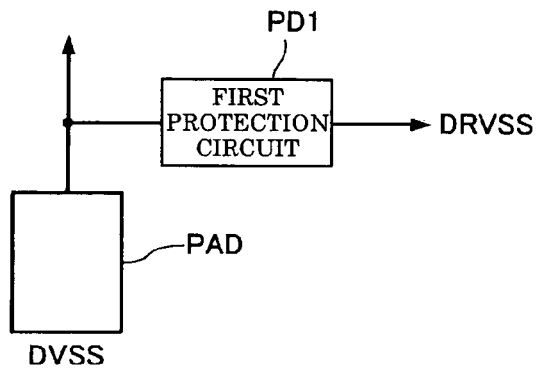

As shown in FIG. 15A, since the protection circuit PD1 is provided in the area very close to the input terminal DVSS, the protection circuit PD1 is easily connected with the input terminal DVSS. Since the protection circuit PD1 is provided on the first side LS in the circuit formation area 122 on the side of the input terminal formation area 124, the protection circuit PD1 is very close to the power supply line DRVSS. Therefore, the protection circuit PD1 is easily connected with the power supply line DRVSS. As shown in FIG. 15B, the first protection circuit PD1 connects the logic power supply voltage input terminal DVSS with the power supply line DRVSS for the display driver 10. The logic power supply voltage input terminal DVSS is connected with the internal circuit.

described above, this embodiment allows the protection circuit PD1 to be efficiently arranged. Specifically, the width SH of the high-speed interface circuit 120 in the direction DR3 can be reduced.

Figure 15C:
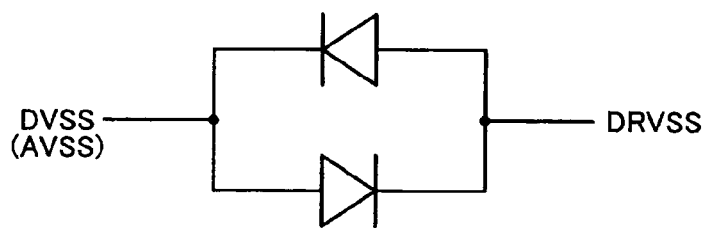

As shown in FIG. 15C, the protection circuit PD1 may be formed by a bidirectional diode.

Although FIG. 15A shows the protection circuit PD1 on the first side LS1 of the high-speed interface circuit 120, the protection circuit PD1 on the third side LS3 also exhibits similar effects.

3.2.2. Second Protection Circuit

Figure 16A:
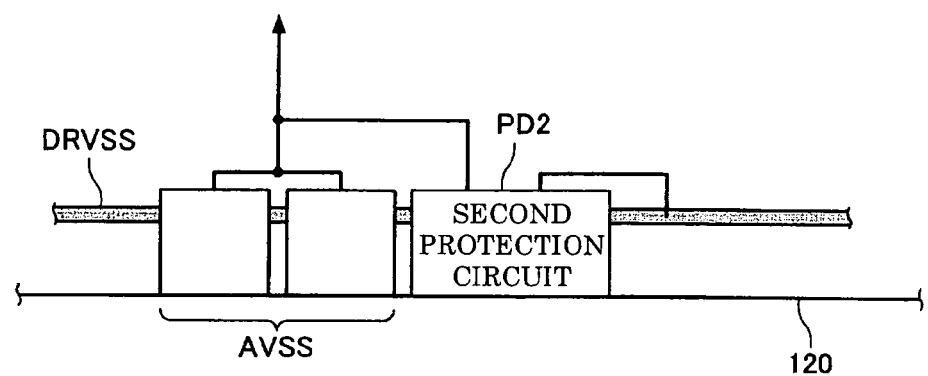
FIGS. 16A to 16B are diagrams showing the connection between each input terminal and a protection circuit.

As shown in FIG. 10, the protection circuits PD2 are formed in the input terminal formation area 124 in the semiconductor layer in the input terminal-to-input terminal area ARBE adjacent to the analog power supply voltage input terminal AVSS. FIG. 16A shows one of the second protection circuits PD2.

Figure 16B:
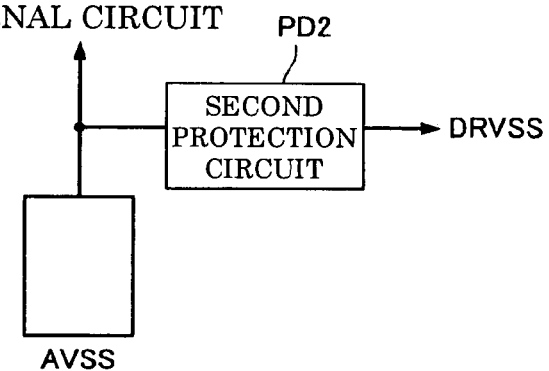

As shown in FIG. 16A, since the protection circuit PD2 is provided in the input terminal-to-input terminal area ARBE adjacent to the input terminal AVSS, the protection circuit PD2 is easily connected with the input terminal AVSS. Since the protection circuit PD2 is formed in the input terminal formation area 124, the protection circuit PD2 is very close to the power supply line DRVSS formed in the lower layer. Therefore, the protection circuit PD2 is easily connected with the power supply line DRVSS. As shown in FIG. 16B, the second protection circuit PD2 connects the analog power supply voltage input terminal AVSS with the power supply line DRVSS for the display driver 10. The analog power supply voltage input terminal AVSS is connected with the internal circuit.

As described above, this embodiment allows the protection circuit PD1 to be efficiently arranged. Specifically, the width SH of the high-speed interface circuit 120 in the direction DR3 can be reduced.

The protection circuit PD2 may be formed the bidirectional diode shown in FIG. 15C in the same manner as the protection circuit PD1.

3.2.3. Cross Section of First and Second Protection Circuits

Figure 17A:
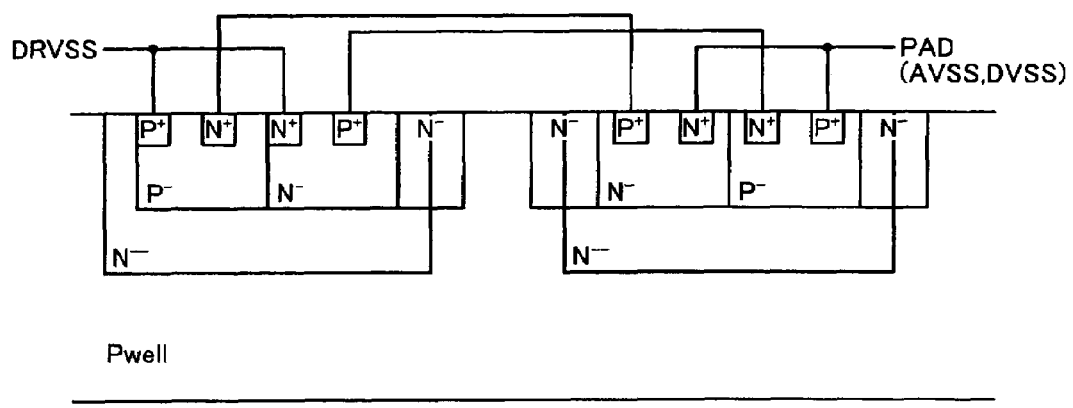
FIGS. 17A and 17B are diagrams showing a configuration example of a protection circuit.
Figure 17B:
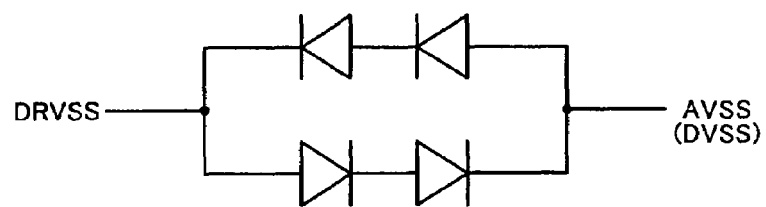

FIG. 17A is a diagram showing the cross section of the first and second protection circuits PD1 and PD2. The protection circuits PD1 and PD2 may have a configuration in which two diodes connected in series and two diodes connected in series are connected in parallel, as shown in FIG. 17B.

As shown in FIG. 17A, the diodes can be interconnected using only the first metal interconnect layer ALA, for example. This prevents interference with the power supply lines DRVSS and DRVDD1 to DRVDD3 formed in the third metal interconnect layer ALC, for example. Specifically, since the interconnects can be formed by effectively utilizing the input terminal formation area 124, the degrees of freedom of the circuit formation area 122 are increased, whereby the layout area of the high-speed interface circuit 120 can be reduced.

3.3. Decoupling Capacitor

Figure 18A:
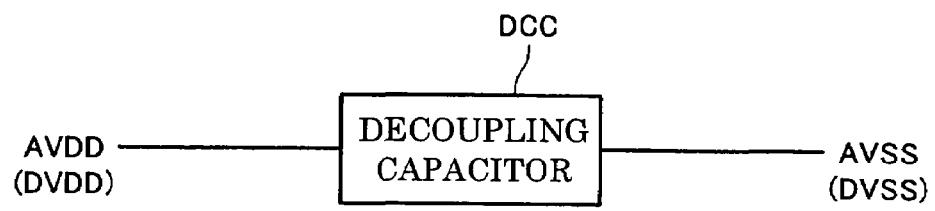
FIGS. 18A and 18B are diagrams showing a connection example of a decoupling capacitor according to one embodiment of the invention.
Figure 18B:
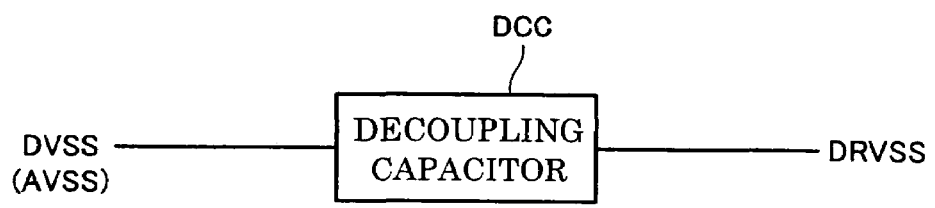

As shown in FIG. 18A, the decoupling capacitor DCC connects the analog power supply voltage input terminal AVDD (or, logic power supply voltage input terminal DVDD) with the analog power supply voltage input terminal AVSS (or, logic power supply voltage input terminal DVSS). This allows a stable power supply to be supplied to the internal circuit by the function of the decoupling capacitor DCC even if the voltages supplied to the input terminals AVDD, AVSS, DVSS, and DVDD become temporarily unstable. Moreover, an analog decoupling capacitor and a logic (digital) decoupling capacitor can be separately provided as the decoupling capacitors DCC.

Since the decoupling capacitor DCC can be provided in the area between other circuits, as shown in FIG. 9, a capacitance sufficient to stabilize the power supply can be secured in the high-speed interface circuit 120.

For example, when mounting the display driver 10 by the COG method, it is difficult to form the decoupling capacitor DCC with a large capacitance on the glass substrate outside the display driver 10. Moreover, the decoupling capacitor DCC for the high-speed interface circuit 120 is generally omitted from the display driver 10 in order to reduce the circuit scale.

According to this embodiment, since the decoupling capacitor DCC with a large capacitance is provided in the high-speed interface circuit 120, the power supply of the high-speed interface circuit 120 can be reliably stabilized when mounting the display driver 10 by the COG method.

As shown in FIG. 18A, the decoupling capacitor DCC connects the power supply line DRVSS for the display driver 10 with the analog power supply voltage input terminal AVSS (or, logic power supply voltage input terminal DVSS). This allows a stable power supply to be supplied to the internal circuit by the function of the decoupling capacitor DCC even if the voltages supplied to the input terminals AVSS and DVSS become temporarily unstable. Moreover, the decoupling capacitor DCC also functions as an electrostatic protection device between the power supply line DRVSS and the analog power supply voltage input terminal AVSS (or, logic power supply voltage input terminal DVSS) by increasing the resistance to static electricity. Therefore, the electrostatic protection function can be increased in comparison with the case of using only the bidirectional diode shown in FIG. 15C as the electrostatic protection device.

4. Other Effects

Figure 19A:
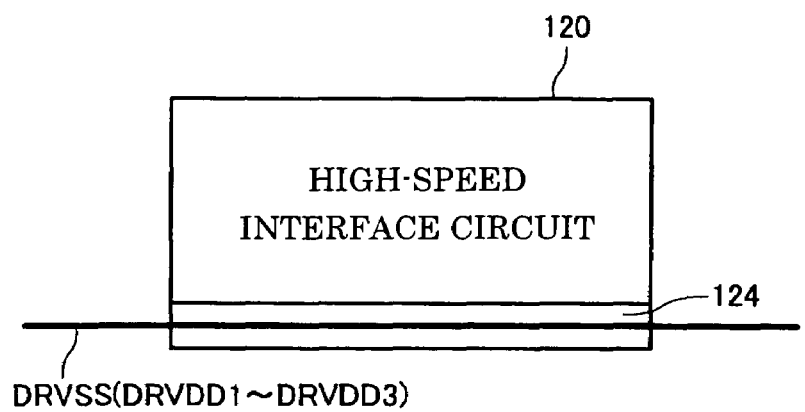
FIG. 19A is a diagram showing an interface circuit block according to one embodiment of the invention.
Figure 19B:
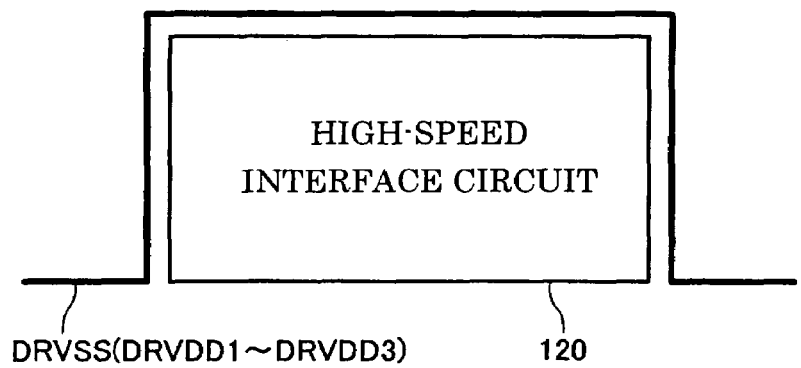
FIG. 19B is a diagram showing a comparative example according to one embodiment of the invention.

In this embodiment, the power supply lines DRVSS and DRVDD1 to DRVDD3 for the display driver 10 are formed in the input terminal formation area 124, as shown in FIG. 19A. Therefore, the power supply lines DRVSS and DRVDD1 to DRVDD3 can be linearly provided in the high-speed interface circuit 120 in the display driver 10. In a comparative example shown in FIG. 19B, the power supply lines DRVSS and DRVDD1 to DRVDD3 are arranged to be routed outside the high-speed interface circuit 120. In this case, the lengths of the power supply lines DRVSS and DRVDD1 to DRVDD3 are increased, and an interconnect area necessary for the power supply lines DRVSS and DRVDD1 to DRVDD3 must be provided in the display driver 10. Therefore, it is difficult to reduce the width DH of the short side of the display driver 10 shown in FIG. 1 in the comparative example.

Specifically, since this embodiment allows the power supply lines DRVSS and DRVDD1 to DRVDD3 to be efficiently disposed in comparison with the comparative example, the width DH of the short side of the display driver 10 can be reduced.

Figure 20:
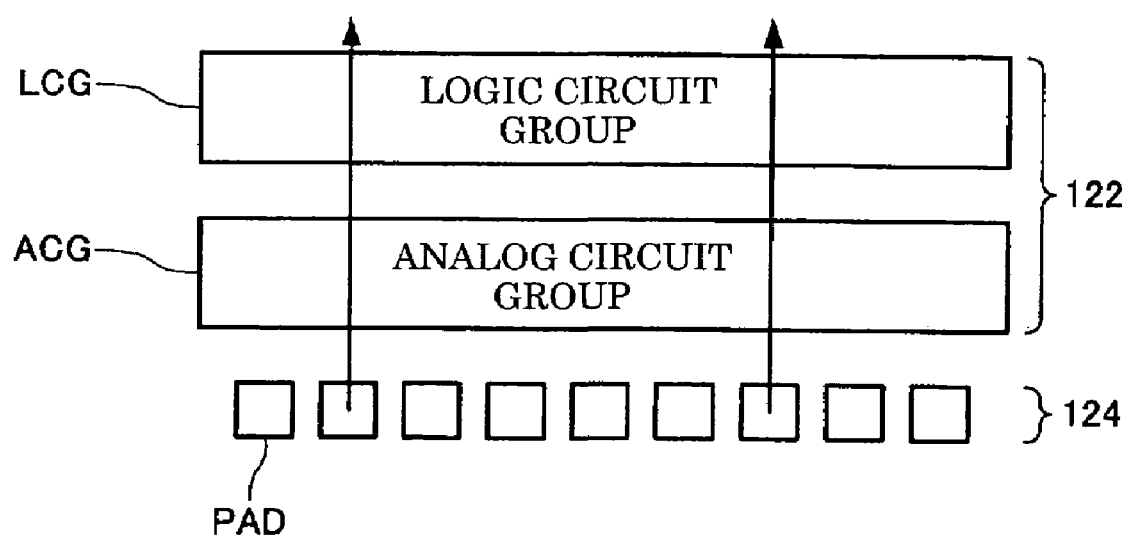
FIG. 20 is a diagram illustrative of a signal flow in an interface circuit block according to one embodiment of the invention.

As shown in FIG. 20, in this embodiment, the signal from each input terminal PAD passes through an analog circuit group ACG in the circuit formation area 122 and flows into a logic circuit group LCG Specifically, since the signal linearly and spontaneously flows from the analog circuit group to the logic circuit group, a high-speed interface circuit 120 exhibiting excellent characteristics can be obtained.

The embodiments of the invention are described above in detail. Those skilled in the art would readily appreciate that various modifications are possible in the embodiments without materially departing from the novel teachings and the advantages of the invention. Accordingly, such modifications are intended to be included within the scope of the invention. Any term cited with a different term having a broader meaning or the same meaning at least once in the specification and the drawings may be replaced by the different term in any place in the specification and the drawings.

Although only some embodiments of the invention are described in detail above, those skilled in the art would readily appreciate that many modifications are possible in the embodiments without materially departing from the novel teachings and advantages of the invention. Accordingly, such modifications are intended to be included within the scope of the invention.

What is claimed is:

1. An integrated circuit device comprising:
an interface circuit block that transfers data through a serial bus using differential signals, when a direction from a first side which is a short side of the interface circuit block to a third side opposite to the first side is defined as a first direction and a direction from a fourth side which is a long side of the interface circuit block to a second side opposite to the fourth side is defined as a second direction,
the interface circuit block including:
a circuit formation area in which a circuit which performs given processing is formed,
an input terminal formation area which is disposed on a side of the circuit formation area in the second direction and in which a plurality of input terminals are provided on the second side along the first direction, and
a plurality of power supply lines for the integrated circuit device formed to extend along the first direction in the input terminal formation area in a first interconnect layer in a lower layer of a second interconnect layer in which the input terminals are formed.

2. The integrated circuit device as defined in claim 1, wherein the input terminals include:
a plurality of differential signal input terminals for supplying the differential signals to the interface circuit block; and
a plurality of power supply input terminals for supplying power to the interface circuit block;
wherein the input terminal formation area includes a differential signal input terminal formation area in which the plurality of differential signal input terminals are formed, a first power supply input terminal formation area and a second power supply input terminal formation area, the plurality of power supply input terminals are formed in the first power supply input terminal formation area and the second power supply input terminal formation area; and
wherein the differential signal input terminal formation area is provided between the first power supply input terminal formation area and the second power supply input terminal formation area.

3. The integrated circuit device as defined in claim 2, wherein the differential signal input terminals are disposed in the differential signal input terminal formation area on the second side along the first direction; and
wherein the power supply input terminals are formed in the first and second power supply input terminal formation areas on the second side along the first direction.

4. The intigrated circuit device defined in claim 2, wherein the power supply input terminals include a plurality of first power supply input terminals for supplying a first power supply voltage, and a plurality of second power supply input terminals for supplying a second power supply voltage higher than the first power supply voltage; and
wherein the power supply lines for the integrated circuit device include a first power supply line for supplying the first power supply voltage.

5. The integrated circuit device defined in claim 4, wherein at least one input terminal on at least one of the first side and the third side among the plurality of input terminals is set as at least one of the first power supply input terminals.

6. The integrated circuit device as defined in claim 5, wherein the first power supply input terminal provided on at least one of the first side and the third side is connected with the first power supply line through a first protection circuit.

7. The integrated circuit device as defined in claim 6, wherein the first protection circuit is formed by a diode.

8. The integrated circuit device as defined in claim 4, wherein at least one of the first power supply input terminals is connected with the first power supply line through a first protection circuit; and
wherein the first protection circuit is disposed in the circuit formation area on a side of the input terminal formation area on at least one of the first side and the third side.

9. The integrated circuit device as defined in claim 4, wherein at least one of the second power supply input terminals is connected with the first power supply line through a decoupling capacitor; and
wherein the decoupling capacitor is disposed in the circuit formation area on at least one of the first side and the third side.

10. The integrated circuit device as defined in claim 4, wherein at least one of the first power supply input terminals is connected with the first power supply line through a second protection circuit; and
wherein the second protection circuit is formed in a semiconductor layer in the input terminal formation area in an area in which the input terminal is not formed and which is located between the differential signal input terminal formed in the differential signal input terminal formation area and the first power supply input terminal formed in at least one of the first and second power supply input terminal formation areas.

11. The integrated circuit device as defined in claim 10, wherein the second protection circuit is not formed in the semiconductor layer in an area in which the plurality of input terminals are formed.

12. The integrated circuit device as defined in claim 11, wherein the second protection circuit is formed by a diode.

13. The integrated circuit device as defined in claim 2, further comprising:
first to Sth receiver circuits, each of which receives the differential signals; and
a bias circuit for supplying a constant voltage to the first to Sth receiver circuits;
wherein the first to [S/2]th ([X] is a maximum integer equal to or less than X) receiver circuits, the bias circuit, and the ([S/2]+1)th to Sth receiver circuits are disposed in that order in the circuit formation area along the first direction.

14. The integrated circuit device as defined in claim 13, wherein the differential signal input terminal formation area is disposed on a side of the first to Sth receiver circuits and the bias circuit in the second direction.

15. The integrated circuit device as defined in claim 13, further comprising:
a logic circuit which processes signals from the first to Sth receiver circuits;
wherein the first to Sth receiver circuits are disposed on a side of the logic circuit in the second direction.

16. An integrated circuit device comprising:
an interface circuit block that transfers data through a serial bus using differential signals,
the interface circuit block having a rectangular shape with a first side, a second side longer than the first side, a third side opposite to the first side and a forth side opposite to the second side, the interface circuit block including:

a circuit formation area;

a plurality of input terminals that are disposed between the circuit formation area and the second side, the plurality of input terminals being disposed along the second side; and a plurality of power supply tines that are disposed below the plurality of input terminals, each of the plurality of power supply lines are formed to extend along the second side.

17. The integrated circuit device as defined in claim 1, the plurality of input terminals including:

a plurality of differential signal input terminals for supplying the differential signals to the interface circuit block; and a plurality of power supply input terminals for supplying power to the interface circuit block, the plurality of differential signal input terminals being provided between a part of the plurality of power supply input terminals and a rest of the plurality of power supply input terminals.

18. The integrated circuit device as defined in claim 2, the plurality of power supply input terminals including a plurality of first power supply input terminals for supplying a first power supply voltage, and a plurality of second power supply input terminals for supplying a second power supply voltage higher than the first power supply voltage, and the plurality of power supply lines including a first power supply line for supplying the first power supply voltage.

* * * * *